United States Patent
Nasu et al.

(10) Patent No.: US 6,372,518 B1
(45) Date of Patent: Apr. 16, 2002

(54) METHOD USING UNREACTIVE GAS ANNEAL AND LOW TEMPERATURE PRETREATMENT FOR FABRICATING LAYERED SUPERLATTICE MATERIALS AND MAKING ELECTRONIC DEVICES INCLUDING SAME

(75) Inventors: Toru Nasu, Kyoto; Koji Arita, Osaka, both of (JP)

(73) Assignee: Matsushita Electric Industrial Co., Ltd. (JP)

(*) Notice: Subject to any disclaimer, the term of this patent is extended or adjusted under 35 U.S.C. 154(b) by 0 days.

(21) Appl. No.: 09/491,512

(22) Filed: Jan. 26, 2000

(51) Int. Cl.[7] .............. H01L 21/00; H01L 21/8242; H01L 21/20
(52) U.S. Cl. .............. 438/3; 438/240; 438/478
(58) Field of Search .............. 438/3, 240, 253, 438/396, 478, 782, 783, 785

(56) References Cited

U.S. PATENT DOCUMENTS

| | | |
|---|---|---|
| 5,046,043 A | 9/1991 | Miller et al. |
| 5,434,102 A | 7/1995 | Watanabe et al. |
| 5,456,945 A | 10/1995 | McMillan et al. |
| 5,466,629 A | 11/1995 | Mihara et al. |
| 5,468,684 A | 11/1995 | Yoshimori et al. |
| 5,508,226 A | 4/1996 | Ito et al. |
| 5,519,234 A | 5/1996 | Paz de Araujo et al. |
| 5,523,964 A | 6/1996 | McMillan et al. |
| 5,803,961 A | 9/1998 | Azuma et al. |
| 5,909,042 A * | 6/1999 | Azuma et al. ............ 257/295 |
| 5,962,069 A | 10/1999 | Schindler et al. |
| 6,245,580 B1 * | 6/2001 | Solayappan et al. ........ 438/3 |
| 6,281,534 B1 * | 8/2001 | Arita et al. ............ 257/295 |

* cited by examiner

Primary Examiner—John F. Niebling
(74) Attorney, Agent, or Firm—Patton Boggs LLP

(57) ABSTRACT

A coating of liquid precursor for forming a layered superlattice material is applied to a substrate, the substrate is dried and then pretreated using RTP at 450 ° C. for 5 minutes. Following the RTP, the substrate is annealed in an unreactive gas at a temperature not exceeding 800° C. then annealed in oxygen gas at a temperature not exceeding 800° C. for one hour to form a thin film of layered superlattice material.

56 Claims, 8 Drawing Sheets

METHOD USING UNREACTIVE GAS ANNEAL AND LOW TEMPERATURE PRETREATMENT FOR FABRICATING LAYERED SUPERLATTICE MATERIALS AND MAKING ELECTRONIC DEVICES INCLUDING SAME

BACKGROUND OF THE INVENTION

1. Field of the Invention

The invention in general relates to the fabrication of layered superlattice materials, and more particularly to a fabrication method using unreactive gas annealing and a low temperature pretreatment to reduce exposure of an integrated circuit to oxygen at elevated temperature.

2. Statement of the Problem

Ferroelectric compounds possess favorable characteristics for use in nonvolatile integrated circuit memories. See Miller, U.S. Pat. No. 5,046,043. A ferroelectric device, such as a capacitor, is useful as a nonvolatile memory when it possesses desired electronic characteristics, such as high residual polarization, good coercive field, high fatigue resistance, and low leakage current. Layered superlattice material oxides have been studied for use in integrated circuits. U.S. Pat. No. 5,434,102, issued Jul. 18, 1995, to Watanabe et al., and U.S. Pat. No. 5,468,684, issued Nov. 21, 1995, to Yoshimori et al., describe processes for integrating these materials into practical integrated circuits. Layered superlattice materials exhibit characteristics in ferroelectric memories that are orders of magnitude superior to alternative types of ferroelectric materials, such as PZT and PLZT compounds.

Integrated circuit devices containing ferroelectric elements with layered superlattice materials are currently being manufactured. A typical ferroelectric memory cell in an integrated circuit contains a semiconductor substrate and a metaloxide semiconductor field-effect transistor ("MOSFET") in electrical contact with a ferroelectric device, usually a ferroelectric capacitor. A ferroelectric memory capacitor typically contains a thin film of ferroelectric metal oxide located between a first, bottom electrode and a second, top electrode, the electrodes typically containing platinum. Layered superlattice materials comprise metal oxides. In conventional fabrication methods, crystallization of the metal oxides to produce desired electronic properties requires heat treatments in oxygen gas at elevated temperatures. The heating steps in the presence of oxygen are typically performed at a temperature in the range of from 800° C. to 900° C. for 30 minutes to two hours. As a result of the presence of reactive oxygen at elevated temperatures, numerous defects are generated in the single crystal structure of the semiconductor silicon substrate, leading to deterioration in the electronic characteristics of the MOSFET. Good ferroelectric properties have been achieved in the prior art using process heating temperatures at about 700° C. to crystallize layered superlattice material. See U.S. Pat. No. 5,508,226, issued Apr. 16, 1996, to Ito et. al. Nevertheless, the annealing and other heating times in the low-temperature methods disclosed in the prior art are in the range of three to six hours, which may be economically unfeasible. More importantly, the long exposure time of several hours in oxygen, even at the somewhat reduced temperature ranges, results in oxygen damage to the semiconductor substrate and other elements of the CMOS circuit.

After completion of the integrated circuit, the presence of oxides may still cause problems because oxygen from the thin film tends to diffuse through the various materials contained in the integrated circuit and combine with atoms in the substrate and in semiconductor layers forming oxides. The resulting oxides interfere with the function of the integrated circuit; for example, they may act as dielectrics in the semiconducting regions, thereby virtually forming capacitors. Diffusion of atoms from the underlying substrate and other circuit layers into the ferroelectric metal oxide is also a problem; for example, silicon from a silicon substrate and from polycrystalline silicon contact layers is known to diffuse into layered superlattice material and degrade its ferroelectric properties. For relatively low-density applications, the ferroelectric memory capacitor is placed on the side of the underlying CMOS circuit, and this may reduce somewhat the problem of undesirable diffusion of atoms between circuit elements. Nevertheless, as the market demand and the technological ability to manufacture high-density circuits increase, the distance between circuit elements decreases, and the problem of molecular and atomic diffusion between elements becomes more acute. To achieve high circuit density by reducing circuit area, the ferroelectric capacitor of a memory cell is placed virtually on top of the switch element, typically a field-effect transistor (hereinafter "FET"), and the switch and bottom electrode of the capacitor are electrically connected by a conductive plug. To inhibit undesired diffusion, a barrier layer is located under the ferroelectric oxide, between the capacitor's bottom electrode and the underlying layers. The maximum processing temperature allowable with current barrier technology is in the range of from 700° C. to 750° C. At temperatures above this range, the highest-temperature barrier materials begin to degrade and lose their diffusion-barrier properties. On the other hand, the minimum feasible manufacturing process temperatures of layered superlattice materials used in the prior art is about 800° C., which is the temperature at which deposited layered superlattice materials are annealed to achieve good crystallization. Lower annealing temperatures require much longer time periods of exposure to oxygen, which can result in damage to the integrated circuit.

For the above reasons, therefore, it would be useful to have a method for fabricating layered superlattice materials in ferroelectric integrated circuits that minimizes the time of exposure to oxygen at elevated temperature, as well as reduces the maximum temperature used.

SUMMARY OF THE INVENTION

The embodiments of the present invention reduce the time of exposure of the integrated circuit to oxygen gas at elevated temperature, and reduce fabrication processing temperatures.

In an important embodiment of the invention, a portion of the time period during which an integrated circuit is heated or annealed at elevated temperature is conducted in an oxygen-free unreactive gas. The oxygen-free gas may be any relatively unreactive gas or mixture of unreactive gases, such as nitrogen and the noble gases, in particular, argon and helium. A useful result of embodiments of the invention is that when a fabrication method includes annealing in unreactive gas for a significant portion of the total annealing time at elevated temperature, then the ferroelectric polarizability of layered superlattice material is as high or higher than the polarizability of layered superlattice material annealed for the same total annealing time in oxygen only.

The invention provides a method of fabricating a thin film of layered superlattice material comprising: providing a substrate and a precursor containing metal moieties in effective amounts for spontaneously forming a layered superlattice material; applying the precursor to the substrate; annealing the solid thin film in an unreactive gas at a temperature in a range of from 600° C. to 800° C.; and annealing the solid thin film in an oxygen-containing gas at a temperature in a range of from 600° C. to 800° C. The invention contemplates that the annealing in an unreactive gas may either precede or come after the annealing in an oxygen-containing gas. The annealing in an unreactive gas may be conducted for a time period in the range of from 30 minutes to 100 hours. The annealing in an oxygen-containing gas is conducted for a time period in the range of from 30 minutes to two hours. In a preferred embodiment, the annealing in an oxygen-containing gas is conducted for a time period not exceeding 60 minutes. Typically, this step of annealing is conducted in substantially pure $O_2$ gas.

A further embodiment of the invention includes heating the substrate after applying the precursor, forming a solid film from the precursor. In an embodiment, the heating is conducted at a temperature not exceeding 600° C. The heating typically comprises a step of drying the precursor coating on the substrate at a temperature not exceeding 300° C. Typically, drying is accomplished by baking in an oxygencontaining gas, preferably in $O_2$ gas.

In another important embodiment of the invention, the heating comprises a step of pretreating the substrate after the precursor is applied and before annealing. Typically, pretreating is conducted in an oxygen-containing gas. Pretreating preferably comprises rapid thermal processing ("RTP") of the substrate having the precursor coating. In a typical embodiment, the rapid thermal processing is conducted at a temperature in the range of from 300° C. to 600° C. for a time period in the range of from 1 minute to 15 minutes. Pretreating also may comprise a hot plate baking of the substrate. Typically, hot plate baking is conducted in air at a temperature in the range of from 300° C. to 600° C. for a time period in the range of from 1 minute to 15 minutes. Pretreating may also comprise a furnace pre-annealing of the substrate. Typically, furnace pre-anneal is conducted at a temperature in the range of from 300° C. to 600° C. for a time period in the range of from 1 minute to 15 minutes.

In another embodiment of the invention, the substrate comprises a first electrode, and the method includes steps of forming a second electrode on the solid thin film, after the step of annealing, to form a capacitor, and subsequently performing a step of post-annealing. In a preferred embodiment, the first electrode and the second electrode contain platinum. The step of post-annealing is conducted at a temperature not exceeding 800° C., preferably for a time period in the range of from 30 minutes to two hours. In one embodiment of the invention, the post-annealing is conducted in an oxygen-containing gas, typically in $O_2$ gas. In a preferred embodiment of the invention, the post-annealing is conducted in oxygen-free unreactive gas, typically $N_2$ gas.

In a preferred embodiment of the invention, an electrically conductive barrier layer is formed on the substrate prior to applying the precursor coating.

The thin film of layered superlattice material typically has a thickness not exceeding 500 nanometers ("nm"). In one embodiment, the layered superlattice material comprises strontium, bismuth and tantalum. In another embodiment, the precursor includes metal moieties for forming a layered superlattice material thin film comprising strontium, bismuth, tantalum and niobium.

In accordance with the invention, the precursor comprises a solution of metal organic precursor compounds containing metal atoms contained in the desired layered superlattice material. Preferably, the metal organic compounds are metal 2-ethylhexanoates.

Numerous other features, objects and advantages of the invention will become apparent from the following description when read in conjunction with the accompanying drawings.

DETAILED DESCRIPTION OF THE PREFERRED EMBODIMENT

1. Overview

Figure 1:
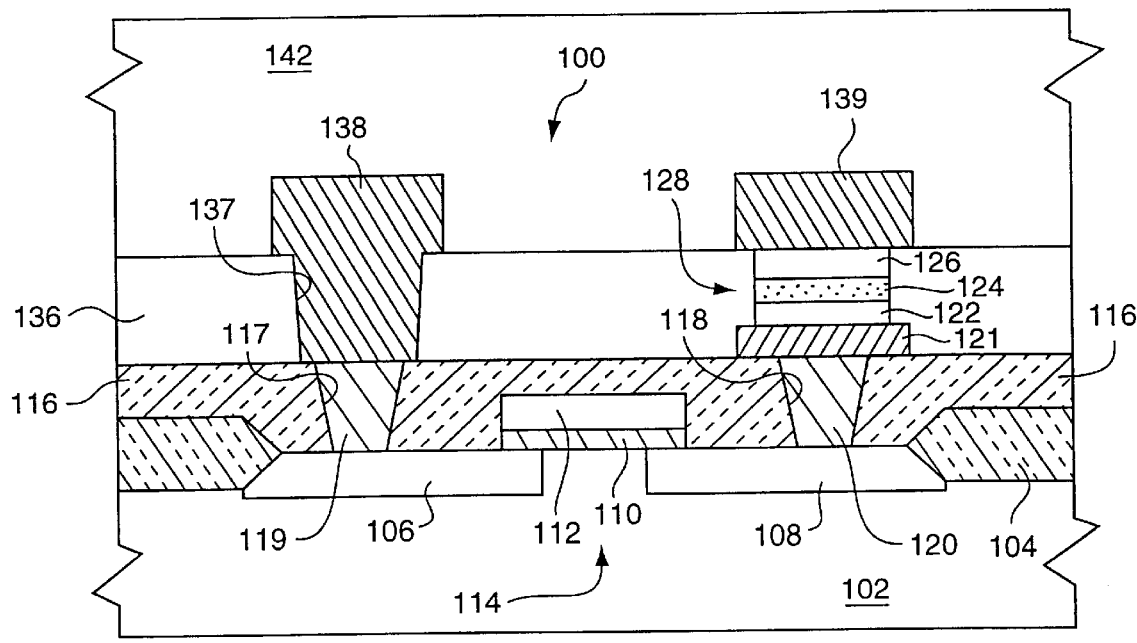
FIG. 1 is a schematic of a cross-sectional view of a portion of an integrated circuit as may be fabricated by the method of the invention showing a nonvolatile ferroelectric memory cell in which the capacitor is located above the switch.
Figure 3:
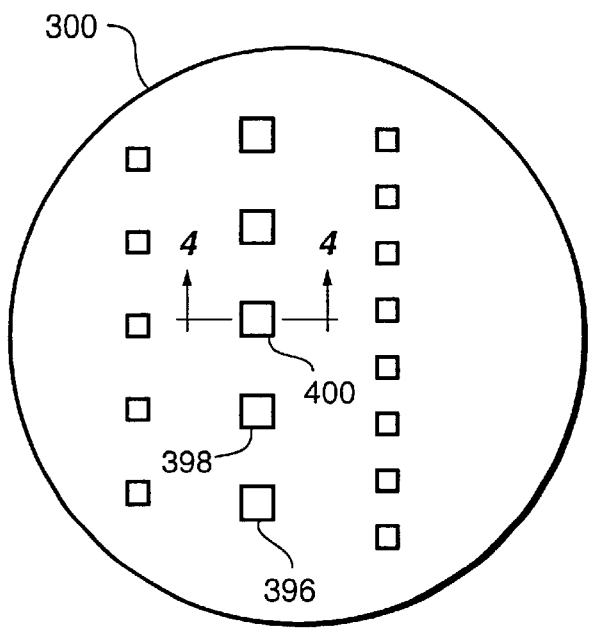
FIG. 3 is a top view of an exemplary wafer on which thin film capacitors fabricated in accordance with the invention are shown greatly enlarged.
Figure 4:
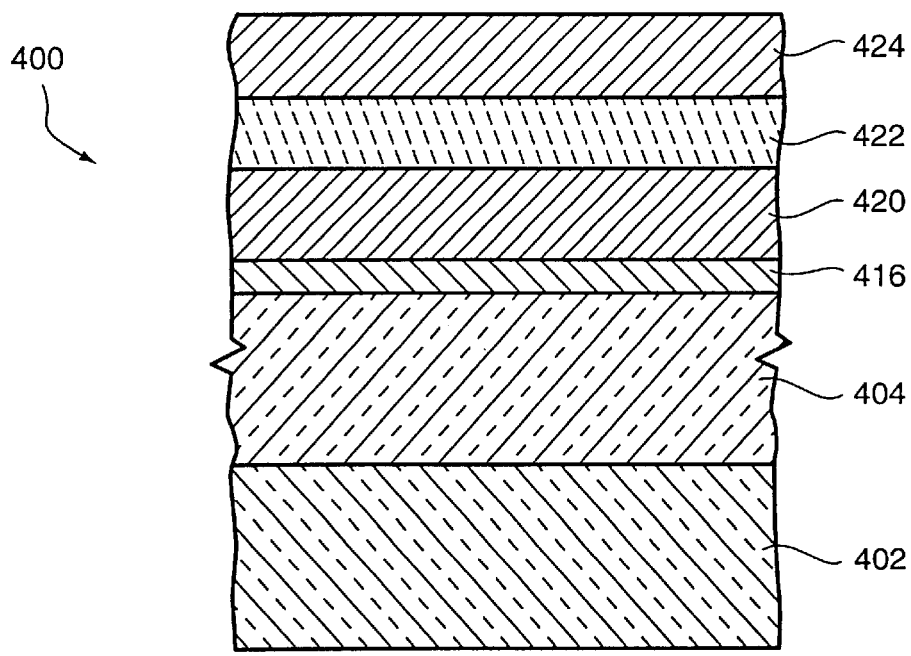
FIG. 4 is a portion of a cross-section of FIG. 3 taken through the lines 4—4, illustrating an exemplary thin film capacitor device fabricated in accordance with the invention.

It should be understood that the FIGS. 1, 3 and 4, depicting integrated circuit devices, are not meant to be actual plan or cross-sectional views of any particular portion of an actual integrated circuit device. In the actual devices, the layers will not be as regular and the thicknesses may have different proportions. The various layers in actual devices often are curved and possess overlapping edges. The figures instead show idealized representations which are employed to explain more clearly and fully the method of the invention than would otherwise be possible. Also, the figures represent only one of innumerable variations of ferroelectric devices that could be fabricated using the method of the invention. FIG. 1 depicts a ferroelectric memory containing a switch in the form of a field effect transistor in electrical connection with a ferroelectric capacitor. However, the method of this invention can also be used in a ferroelectric FET memory in which the ferroelectric element comprising layered superlattice material is incorporated in the switch element. Such a ferroelectric FET was described in McMillan, U.S. Pat. No. 5,523,964. Likewise, other integrated circuits fabricated using the method of the invention could include other elements and compositions of material.

FIG. 1 shows a cross-sectional view of an exemplary nonvolatile ferroelectric memory 100 fabricated in accordance with the invention. The general manufacturing steps for fabricating integrated circuits containing MOSFETs and ferroelectric capacitor elements are described in Mihara, U.S. Pat. No. 5,466,629, and Yoshimori, U.S. Pat. No. 5,468,684, which are hereby incorporated by reference as if fully disclosed herein. General fabrication methods have been described in other references also. Therefore, the elements of the circuit of FIG. 1 will be simply identified here.

In FIG. 1, a field oxide region 104 is formed on a surface of a silicon substrate 102. A source region 106 and a drain region 108 are formed separately from each other within silicon substrate 102. A gate insulating layer 110 is formed on the silicon substrate 102 between the source and drain regions 106 and 108. Further, a gate electrode 112 is formed on the gate insulating layer 110. These source region 106, drain region 108, gate insulating layer 110 and gate electrode 112 together form a MOSFET 114.

A first interlayer dielectric layer (ILD) 116 made of BPSG (boron-doped phospho-silicate glass) is formed on substrate 104 and field oxide region 102. ILD 116 is patterned to form vias 117, 118 to source region 106 and drain region 108, respectively. Vias 117,118 are filled to form plugs 119,120, respectively. Plugs 119, 120 are electrically conductive and typically comprise polycrystalline silicon. A diffusion barrier layer 121 is formed and patterned on ILD 116 to be in electrical contact with plug 120. The diffusion barrier layer 121 is made of, for example, titanium nitride, and typically has a thickness of 10 nm to 20 nm. Diffusion barrier layers, such as titanium nitride, inhibit the diffusion of chemical species between the underlying and overlying layers of the memory 100.

As depicted in FIG. 1, a bottom electrode layer 122 made of platinum and having a thickness of 100 nm is deposited on diffusion barrier layer 121. Then a ferroelectric thin film 124 oflayered superlattice material is formed on bottom electrode layer 122. A top electrode layer 126, made of platinum and having a thickness of 100 nm, is formed on ferroelectric thin film 124. Bottom electrode layer 122, ferroelectric thin film 124 and top electrode layer 126 together form ferroelectric capacitor 128. The composition of ferroelectric thin film 124 is discussed in more detail below.

Wafer substrate 102 may comprise silicon, gallium arsenide or other semiconductor, or an insulator, such as silicon dioxide, glass or magnesium oxide (MgO). The bottom and top electrodes of ferroelectric capacitors conventionally contain platinum. It is preferable that the bottom electrode contains a non-oxidized precious metal such as platinum, palladium, silver, and gold. In addition to the precious metal, metal such as aluminum, aluminum alloy, aluminum silicon, aluminum nickel, nickel alloy, copper alloy, and aluminum copper may be used for electrodes of a ferroelectric memory. Adhesive layers (not shown), such as titanium, enhance the adhesion of the electrodes to adjacent underlying or overlying layers of the circuits.

A second interlayer dielectric layer (ILD) 136 made of NSG (nondoped silicate glass) is deposited to cover ILD 116, diffusion barrier layer 121, and ferroelectric capacitor 128. A PSG (phospho-silicate glass) film ora BPSG (boron phospho-silicate glass) film could also be used in layer 136.

ILD 136 is patterned to form a via 137 to plug 119. A metallized wiring film is deposited to cover ILD 136 and fill via 137 and then patterned to form plug 137, source electrode wiring 138 and top electrode wiring 139. Wirings 138, 139 preferably comprise Al—Si—Cu standard interconnect metal with a thickness of about 200 nm to 300 nm.

FIG. 1 depicts only one of many variations of nonvolatile ferroelectric memory cells that can be fabricated using a method in accordance with the invention. For example, although the ferroelectric element depicted in FIG. 1 is substantially above the switch element, the invention may be used to fabricate a thin film of layered superlattice material in an element displaced to the side of the switch. Also, the method of the invention may be applied to fabricate ferroelectric memory capacitors in which the electrically conductive diffusion barrier layer functions both as a diffusion barrier and as an electrode of the capacitor; or the method of the invention may be used to fabricate circuits that contain no oxygen barrier layer under the ferroelectric thin film. In addition, the method of the invention may be applied to fabricate ferroelectric field effect transistors (FETS) and other devices utilizing ferroelectric materials. See U.S. Pat. No. 5,523,964 issued Jun. 4, 1996 to McMillan et al., which is hereby incorporated by reference as though fully disclosed herein.

U.S. Pat. No. 5,519,234 issued May. 21,1996, to Carlos A. Paz de Araujo et al., is hereby incorporated herein by reference as though fully disclosed herein, and discloses that layered superlattice compounds, such as strontium bismuth tantalate, have excellent properties in ferroelectric applications as compared to the best prior materials and have high dielectric constants and low leakage currents. U.S. Pat. No. 5,434,102 issued Jul. 18,1995, to Watanabe et al. and No. 5,468,684 issued Nov. 21, 1995, to Yoshimori et al., also both hereby incorporated by reference as though fully disclosed herein, describe processes for integrating these materials into practical integrated circuits.

The layered superlattice materials may be summarized generally under the formula:

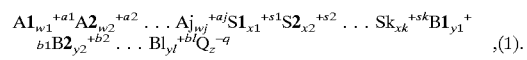

,(1).

where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements; for example, if Q is oxygen, then q=2. The subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary uniformly throughout the material; for example, in $SrBi_2(Ta_{0.75}Nb_{0.25})_2O_9$, 75% of the B-sites are occupied by strontium atoms, and 25% of the B-sites are occupied by barium atoms. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include cases where either of the sites and the superlattice generator can have multiple elements. The value of z is found from the equation:

$$(a1w1+a2w2 \ldots +ajwj)+(s1x1+s2x2 \ldots +skxk)+(b1y1+b2y2 \ldots +blyl)=qz. \quad (2)$$

Formula (1) includes all three of the Smolenskii type compounds discussed in U. S. Pat. No. 5,519,234 issued May. 21, 1996, referenced above. The layered superlattice materials do not include every material that can be fit into formula (1), but only those which spontaneously form themselves into crystalline structures with distinct alternating layers. Preferably, the layered superlattice materials are polycrystalline.

U.S. Pat. No. 5,803,961, issued Sep. 8, 1998, to Azuma et al., which is hereby incorporated herein by reference as though fully disclosed herein, discloses that mixed layered superlattice materials, such as strontium bismuth tantalum niobate, can have even more improved properties in ferroelectric applications. The mixed layered superlattice materials are characterized by nonstoichiometric amounts of A-site and B-site elements. For example, a preferred precursor used in accordance with the invention comprises metal organic precursor compounds having metals in relative molar proportions corresponding to the stoichiometrically unbalanced formula $Sr_{0.833}Bi_2Ta_{1.667}Nb_{0.167}O_{8416}$.

The word "substrate" can mean the underlying wafer 102 on which the integrated circuit is formed, as well as any object on which a thin film layer is deposited, such as BPSG layer 116. In this disclosure, "substrate" shall mean the object to which the layer of interest is applied; for example, when we are talking about a bottom electrode, such as 122, the substrate includes the layers 121 and 116 on which electrode 122 is formed.

The term "thin film" is used herein as it is used in the integrated circuit art. Generally, it means a film of less than a micron in thickness. The thin films disclosed herein are typically less than 500 nm in thickness. Preferably, the thin film of layered superlattice material is 50 nm to 250 nm thick. These thin films of the integrated circuit art should not be confused with the layered capacitors of the macroscopic capacitor art which are formed by a wholly different process that is incompatible with the integrated circuit art.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced"stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$ and $SrBi_2(Ta_{1.5} Nb_{0.5})O_9$ are balanced stoichiometric formulae. In contrast, a precursor for strontium bismuth tantalum niobate in which the molar proportions of strontium, bismuth, tantalum, and niobium are 0.9, 2.18, 1.5, and 0.5, respectively, is represented herein by the unbalanced "stoichiometric" formula $Sr_{0.9} Bi_{2.18}(Ta_{1.5} Nb_{0.5})O_9$, since it contains excess bismuth and deficient strontium relative to the B-site elements tantalum and niobium.

2. Description of Preferred Method

In general, some form of heating or annealing of a layered superlattice material in oxygen at elevated temperature is necessary for desired formation and crystallization of the metal oxide material. An important feature of embodiments of the invention is that for a significant portion of the total annealing times at elevated temperature, annealing is conducted in an unreactive gas. In the embodiments described in detail in this specification, annealing in an unreactive gas is followed by annealing in an oxygen-containing gas. The invention also includes, however, embodiments in which annealing in an oxygen-containing gas is followed by annealing in an unreactive gas. The term "elevated temperature" as used herein generally refers to a temperature in excess of 300° C. The term "gas" is used in its broader sense of being either a pure gas or a mixture of several gases. The term "oxygen-containing"means that the relative amount of oxygen present is not less than one mole-percent.

The word "precursor" used herein can mean a solution containing one metal organic solute that is mixed with other precursors to form intermediate precursors or final precursors, or it may refer to a final liquid precursor solution, that is, the solution to be applied to a particular surface during fabrication. The precursor as applied to the substrate is usually referred to as the "final precursor" "precursor mixture", or simply "precursor". In any case, the meaning is clear from the context. The composition of a precursor may be described in two ways. The actual dissolved metal organic precursor compounds (solutes) and solvents and concentrations may be specified; or, for the sake of clarity, the stoichiometric formula representing the composition of the final oxide compound to be formed with the precursor may be specified.

Metal organic liquid precursors used in accordance with the invention can be manufactured reliably. Their composition can be easily controlled and varied, if necessary. They can be safely stored for long periods, up to six months. They are relatively nontoxic and nonvolatile, compared to precursors of the prior art. Metal oxide thin film layers formed in accordance with the invention have smooth, continuous and uniform surfaces, and they can be reliably fabricated to have thicknesses in the range of from 5 nm to 500 nm, maintaining important structural and electrical characteristics.

Individual precursor compounds of a precursor solution forfabricating a layered superlattice material thin film may be selected from the group including metal betadiketonates, metal polyalkoxides, metal dipivaloylmethanates, metal cyclopentadienyls, metal alkoxycarboxylates, metal carboxylates, metal al koxid es, metal ethylhexanoates, octanoates, and neodecanoates. Preferably, a metal precursor compound comprises a metal 2-ethylhexanoate, which is well suited for use in a liquid-source misted chemical deposition ("LSMCD") technique. An individual metal organic decomposition ("MOD") precursor compound is formed, for example, by interacting each metal of a desired compound, for example, strontium, bismuth, tantalum or niobium, or an alkoxide of the metal, with a carboxylic acid, or with a carboxylic acid and an alcohol, and dissolving the reaction product in a solvent. Carboxylic acids that may be used include 2-ethylhexanoic acid, octanoic acid, and neo-decanoic acid, preferably 2-ethylhexanoic acid. Alcohols that may be used include 2-methoxyethanol, 1-butanol, 1-pentanol, and 2-pentanol. Solvents that may be used include xylenes, n-octane, -butyl acetate, n-dimethylformamide, 2-methoxyethyl acetate, methyl isobutyl ketone, and methyl isoamyl ketone, as well as many others. The metal, metal alkoxide, acid, and alcohol react to form a mixture of metalalkoxocarboxylate, metal-carboxylate and/or metal-alkoxide, which mixture is heated and stirred as necessary to form metal-oxygen-metal bonds and boil off any low-boiling point organics that are produced by the reaction. Initial MOD precursors are usually made or bought in batches prior to their use; the final precursor mixtures are usually prepared immediately before application to the substrate. Final preparation steps typically include mixing, solvent exchange, and dilution. When using a liquid deposition technique, for example, LSMCD, a metal 2-ethylyhexanoate is a preferred precursor compound because the ethylyhexanoates are stable in solution, have a long shelf life, form smooth liquid films, and decompose smoothly on a substrate. The ethoxyhexanoates and other metalorganic precursor compounds may be stored for periods of several months when dissolved in xylenes or n-octane.

Terms such as "heating", "drying", "baking", "rapid thermal process" ("RTP"), "annealing", and others involve the application of heat. For the sake of clarity, the various terms are used to distinguish certain techniques and method steps from one another. Nevertheless, it is clear that similar techniques may be used to accomplish differently named process steps; for example, drying, baking and annealing typically may be accomplished using the same apparatus, the only differences being their function and position in a fabrication sequence, or the particular temperatures used. As a result, it would be possible to designate an annealing step as a heating step, or a drying step as a baking step. To avoid confusion, therefore, the general term "heating" may also be used to describe a fabrication step, especially in the claims describing the invention. It is further understood that one skilled in the art may accomplish a desired process result using heat as disclosed herein, while referring to the process with a term different from the one used herein.

Figure 2:
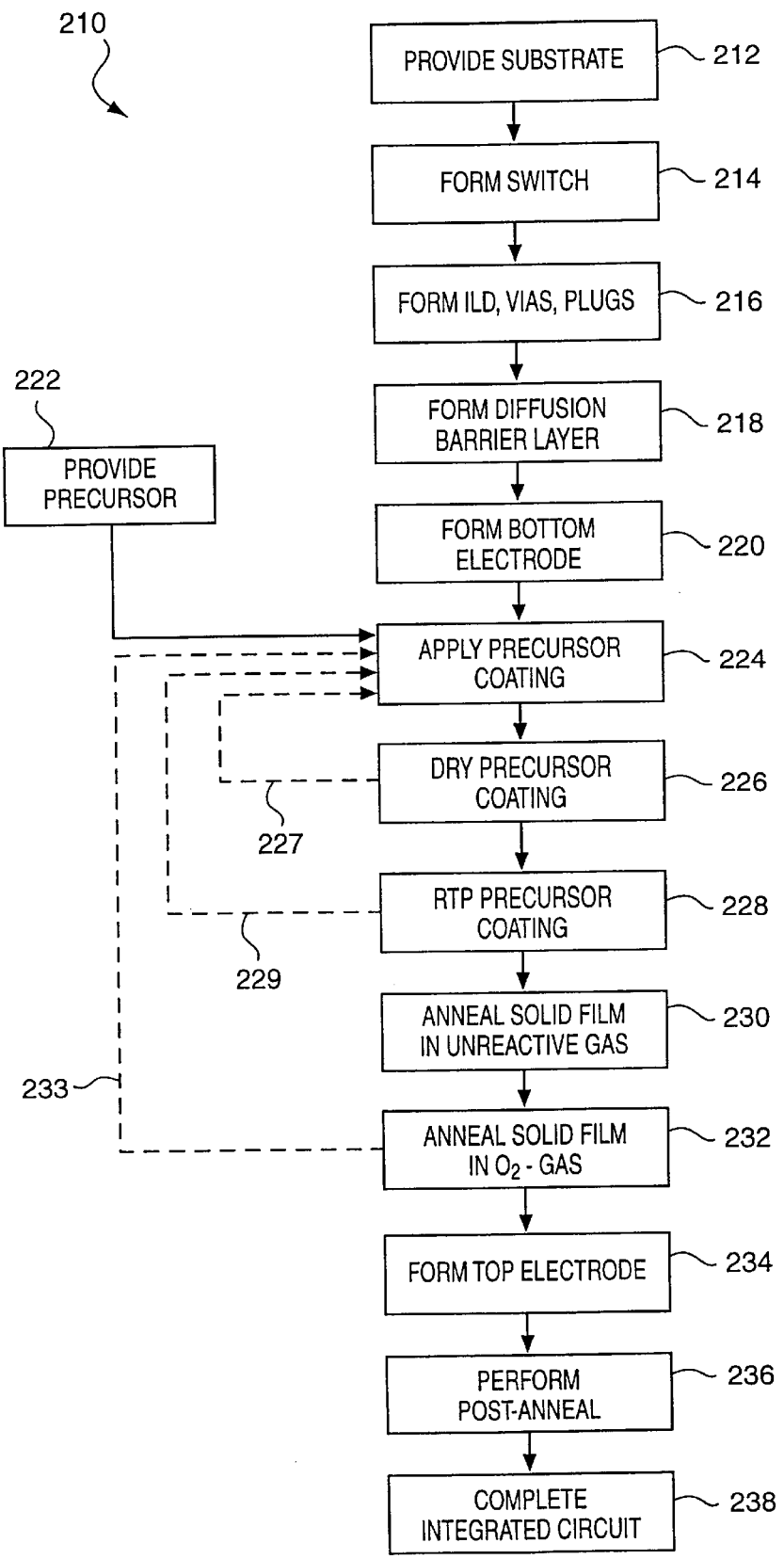
FIG. 2 is a flow chart showing the preferred embodiment of a process for fabricating a nonvolatile ferroelectric memory device in accordance with the invention.

The diagram of FIG. 2 is a flow chart of the fabrication steps of a method 210 in accordance with the invention to make a ferroelectric memory as depicted in FIG. 1. In step 212, a semiconductor substrate is provided on which a switch is formed in step 214. The switch is typically a MOSFET. In step 216, an insulating layer is formed by conventional techniques to separate the switching element from the ferroelectric element to be formed. Using conventional processes, the insulating layer is patterned to form vias, which are filled with conductive plugs to electrically connect the switch to the memory capacitor and the rest of the integrated circuit. In step 218, a diffusion barrier layer is deposited on the insulating layer and patterned. Preferably, the diffusion barrier comprises titanium nitride and has a thickness of about 10 nm to 20 nm. Preferably, the diffusion barrier is deposited by a conventional sputtering method, using a titanium nitride target, although a titanium target with a nitrogencontaining sputter gas may also be used. In step 220, a bottom electrode is formed. Preferably, the electrode is made of platinum and is sputter-deposited to form a layer with a thickness of about 200 nm. In step 222, chemical precursors of the layered superlattice material that will form the desired ferroelectric thin film are prepared. Usually, precursor solutions are prepared from commercially available solutions containing the chemical precursor compounds. However, the preferred embodiment of the inventive method utilizes a liquid precursor solution containing relative molar proportions of the elements strontium, bismuth, and tantalum corresponding approximately to the formula $Sr_{0.9} Bi_{2.18} Ta_2 O_9$; therefore, if necessary, the concentrations of the various precursors supplied in the commercial solutions are adjusted in step 222 to accommodate particular manufacturing or operating conditions. In accordance with the invention, a liquid coating of precursor solution is applied to the substrate in step 224. The precursor for forming the ferroelectric thin film of layered superlattice material is applied to the bottom electrode in step 224. In accordance with the invention, the precursor may be applied using a conventional liquid deposition technique, such as a misted deposition method as described in U.S. Pat. No. 5,456,945, or a spin-coating method. In the examples below, the substrate is spun at 1100 rpm to 1800 rpm for 30 to 40 seconds. In drying step 226, the substrate with the coating of liquid precursor is baked and dried at a temperature not exceeding 300° C. Preferably, the drying step is conducted on a hot plate in substantially pure $O_2$ gas, or at least in an oxygen-containing gas, for a time period not exceeding 15 minutes.

Then, in step 228, the dried precursor coating on the substrate is subjected to rapid thermal processing ("RTP"). The RTP is conducted at a temperature in a range of from 300° C. to 600° C., for a time period in the range of from 5 seconds to 15 minutes. Preferably, the RTP is conducted at 450° C. for 5 minutes with a ramping rate of 100° C. per second. Radiation from a halogen lamp, an infrared lamp, or an ultraviolet lamp provides the source of heat for the RTP step. In the examples below, an AG Associates Model 410 Heat Pulser utilizing a halogen source was used. Preferably, the RTP is performed in an oxygen-containing gas, most preferably in substantially pure $O_2$ gas. Any residual organics are burned out and vaporized during the RTP process. At the same time, the rapid temperature rise of the RTP promotes nucleation; that is, the generation of numerous crystalline grains of the layered superlattice material in the solid film produced by the baking and RTP of the precursor coating. These grains act as nuclei upon which further crystallization can occur. The presence of oxygen in the RTP process enhances formation of these grains.

In first annealing step 230, the substrate with the dried solid film resulting from steps 224–228 is annealed in an unreactive gas at a temperature in the range of from 600° C. to 800° C. This is followed by a second annealing step 232, in which the substrate with solid film is annealed in an oxygen-containing gas at a temperature in the range of from 600° C. to 800° C. The annealing time of step 230 in the unreactive gas may be relatively long; for example, 100 hours. Preferably, the annealing time in oxygen of step 232 does not exceed 60 minutes. The oxygen-annealing of step 232 can be conducted in air, in an oxygen-rich gas having an oxygen content greater than that of air, or in an "oxygen-deficient" gas, in which the relative amount of oxygen is less than the relative amount of oxygen in air. Typically, it is performed in $O_2$ gas.

If the precursor is applied using spin-on techniques, the sequence of steps 224–232 may be conducted a plurality of times (indicated by the dashed process flowline 233 in FIG. 2) to achieve the desired quality and thickness of the ferroelectric thin film. Depending on the spin-on coating technique, the thickness of the thin film after one sequence of steps 224–232 ranges between 40 nm and 100 nm. Preferably, two sequences of steps 224–232, each sequence forming a layer with a thickness of 40 nm to 100 nm, are used to form a ferroelectric thin film with a total thickness of 80 nm to 200 nm. For process-economical reasons, however, it might be desirable to form a thin film of 80 nm to 100 nm thickness using one sequence of steps 224–232; or a sequence of spin-on coating 224 and drying 226 may be repeated, as indicated by dashed process flowline 227, before RTP or annealing is conducted. In another embodiment, a sequence of spin-coating 224, drying 226 and RTP pre-anneal 228 may be repeated, as indicated by dashed process flowline 229, before annealing steps 230, 232; or, to increase circuit density, it might be preferable, for example, to use one sequence of steps 224–232 to form a thin film having a thickness in the range of 40 nm to 100 nm. Use of misted deposition or CVD techniques is preferred if thin films with good step coverage over non-planar electrodes are required, especially for high-density ferroelectric memories.

Following steps 224–232, the top electrode is formed in step 234. Preferably, the electrode is formed by RF sputtering of a platinum single layer, but it also may be formed by DC sputtering, ion beam sputtering, vacuum deposition, or other appropriate conventional deposition process. If desirable for the electronic device design, before the metal deposition, the ferroelectric layered superlattice material may be patterned using conventional photolithography and etching, and the top electrode is then patterned in a second process after deposition. In the examples described below, the top electrode and layered superlattice material are patterned together using conventional photolithography techniques and ion beam milling.

In step 236, post-annealing is performed, preferably at a temperature in the range of from 600° C. to 800° C. that does not exceed the temperature of the annealing in steps 230–232. Preferably, post-annealing step 236 is performed for a time period not exceeding 30 minutes. Post-annealing step 236 may be performed in substantially pure $O_2$ gas, or in substantially pure $N_2$ gas or other unreactive gas, or in mixtures of the two types of gases, such as air. As deposited, the adhesion of the top electrode to the thin film of layered superlattice material is usually weak. The adhesion is improved by post-annealing. The post-anneal is preferably performed in an electric furnace at a temperature between 600° C. and the anneal temperature, which does not exceed 800° C. A post-anneal below 500° C. does not improve the adhesion of the electrode, and the resulting capacitor devices would tend to be extremely leaky, and shorted in the worst cases.

The post-anneal releases the internal stress in the top electrode and in the interface between the electrode and the ferroelectric thin film. At the same time, the post-annealing step 236 reconstructs microstructure in the layered superlattice material resulting from the sputtering of the top electrode, and as a result improves the properties of the material. The effect is the same whether the post-anneal is performed before or after the patterning steps mentioned in connection with step 238 below. With regard to most electrical properties, unreactive gas, such as helium, argon, and nitrogen, may be used with approximately the same result as with oxygen, thereby decreasing exposure of the integrated circuit to oxygen at elevated temperature.

The circuit is generally completed in step 238, which can include a number of substeps; for example, deposition of an ILD, patterning and milling, and deposition of wiring layers.

FIG. 3 is a top view of an exemplary wafer 300 on which thin film capacitors 396, 398 and 400 fabricated on a semiconductor wafer substrate in accordance with the invention are shown greatly enlarged. FIG. 4 is a portion of a cross-section of FIG. 3 taken through the lines 4—4, illustrating a thin film capacitor device fabricated in accordance with the invention. A silicon dioxide layer 404 is formed on a silicon crystal substrate 402. A titanium layer is sputtered onto layer 404, and then the titanium is oxidized to form a titanium oxide layer 416. Then bottom electrode 420 made of platinum is sputter-deposited on layer 404. Layer 422 is a ferroelectric thin film, and layer 424 represents the top electrode made of platinum.

In the examples below, the ferroelectric polarizability of strontium bismuth tantalum niobate capacitors made in accordance with the invention was studied by measuring hysteresis curves in a range of voltages.

EXAMPLE 1

Ferroelectric thin film capacitors containing layered superlattice material were fabricated, in accordance with the invention, by annealing in $N_2$ at 700° C. prior to annealing in $O_2$ at 700° C. Also, capacitors were fabricated using conventional annealing techniques in oxygen only. The remanent polarization of the capacitors were measured and compared to study the effects of annealing time and annealing gas on polarizability.

The capacitors were fabricated using a final liquid precursor containing metal moieties having relative molar proportions corresponding to the stoichiometric formula $Sr_{0.833}Bi_2Ta_{1.667}Nb_{0.167}O_{8.416}$. The metal organic precursor compounds dissolved in the final precursor solution were metal 2-ethylhexanoates. A 0.2 molar solution of the metal 2-ethylhexanoates in n-octane was diluted to 0.1 molar concentration with n-butyl acetate immediately before use. The capacitors were formed by applying two liquid coatings using a spin-on technique.

A series of p-type 100 Si wafer substrates 402 were oxidized to form a layer of silicon dioxide 404. An adhesion layer consisting substantially of titanium having a thickness of about 50 nm was deposited on the substrate; oxidation during subsequent high-temperature treatment resulted in titanium oxide layer 416. Platinum bottom electrode 420 having a thickness of 300 nm was sputter deposited on titanium oxide layer 416. Next, the wafers were dehydrated for 30 minutes at 180° C. in low vacuum. Onto each wafer, a spincoat of the 0.1 molar solution of the strontium bismuth tantalum niobate ("SBTN") precursor was deposited on bottom electrode 420 at 1100 rpm for 40 seconds. This first coating was dehydrated by baking on a hot plate in air for one minute at 160° C., followed by four minutes at 260° C. Then a first-layer anneal of the wafers was conducted at 700° C. Wafer 1 was annealed in a furnace at 700° C. in $O_2$ gas for 10 minutes. Wafer 2 was annealed in $O_2$ gas for 20 minutes. Wafer 3 was annealed in $N_2$ gas for 10 minutes, then in $O_2$ gas for 10 minutes.

A second spin-on coating was applied to Wafers 1–3 and dried, as above. Thereafter, a second-layer anneal at 700° C. was conducted. Wafer 1 was annealed at 700° C. in a furnace in $O_2$ gas for 60 minutes. Wafer 2 was annealed in $O_2$ gas for 120 minutes. Wafer 3 was annealed in $N_2$ gas for 60 minutes, then in $O_2$ gas for 60 minutes.

These steps formed ferroelectric thin films 422 having a thickness of about 205 nm. Platinum was sputter-deposited to make a top electrode layer 424 with a thickness of about 200 nm. The platinum and strontium bismuth tantalum niobate layers were milled to form the capacitors, and then ashing was performed, followed by a post-anneal for 30 minutes at 700° C. in $O_2$ gas. The capacitors had a surface area of 6940 $\mu m^2$. Capacitors fabricated on all three wafers received a post-anneal for 30 minutes.

Thus, the ferroelectric layered superlattice material thin films in capacitors fabricated on Wafer 1 had a history of a first-layer anneal in $O_2$ for 10 minutes, and a second-layer anneal in $O_2$ for 60 minutes ("$1 \times O_2$"). The ferroelectric thin films in capacitors fabricated on Wafer 2 had a history of a first-layer anneal in $O_2$ for 20 minutes, and a second-layer anneal in $O_2$ for 120 minutes ("$2 \times O_2$"). The ferroelectric thin films in capacitors fabricated on Wafer 3 had a history of a first-layer anneal in $N_2$ for 10 minutes and in $O_2$ for 10 minutes, and a second-layer anneal in $N_2$ for 60 minutes and in $O_2$ for 60 minutes ("$N_2+O_2$").

Figure 5:
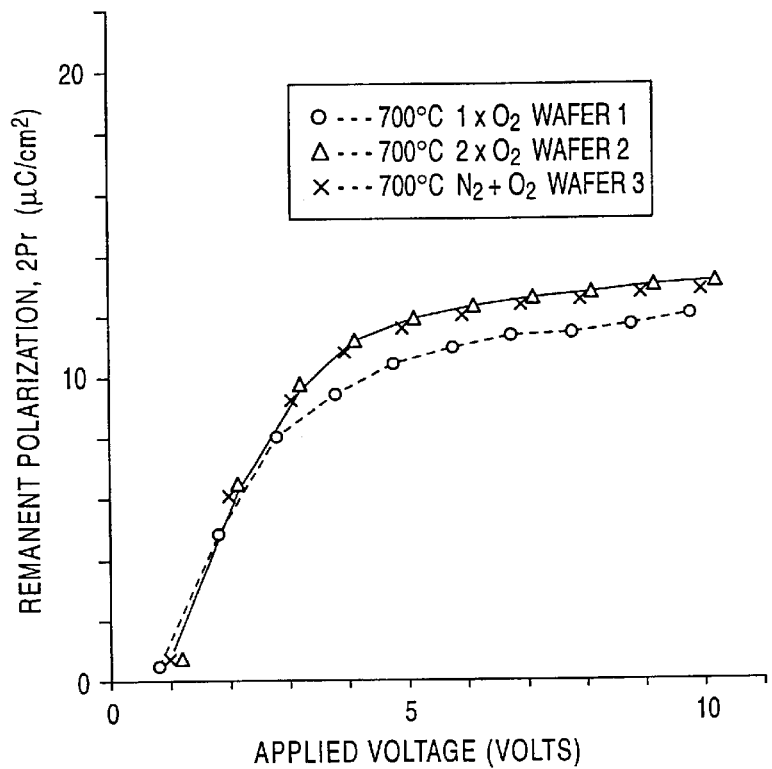
FIG. 5 is a graph of remanent polarization, 2Pr, in units of $\mu C/cm^2$, plotted as a function of applied voltage between 1 and 10 volts, in capacitors annealed at 700° C.

The remanent polarizations of exemplary capacitors from Wafers 1–3 were calculated from hysteresis curves of the capacitors. The hysteresis curves were measured at various applied voltages in the range of 1–10 volts. FIG. 5 is a graph of remanent polarization, 2Pr, in units of $\mu C/cm^2$, plotted as a function of applied voltage between 1 and 10 volts. The data of the exemplary capacitors of Wafers 1, 2 and 3 are labeled "$1 \times O_2$", "$2 \times O_2$" and "$N_2+O_2$", respectively. As expected from the prior art, the data indicated that remanent polarization in a $2 \times O_2$ capacitor was higher than in a $1 \times O_2$ capacitor. This was expected because the exposure to $O_2$-gas at the elevated temperature of 700° C. was twice as long in the $2 \times O_2$ capacitor as in the $1 \times O_2$ capacitor. Unexpectedly, the remanent polarization in the $N_2+O_2$ capacitor was virtually the same as in the $2 \times O_2$ capacitor. The remanent polarization from the graph at 5 volts of both the $N_2+O_2$ and the $2 \times O_2$ capacitors is about 12 $\mu C/cm^2$, while the corresponding value of the $1 \times O_2$ capacitor is about 11 $\mu C/cm^2$. Thus, in accordance with the invention, the remanent polarization increases by increasing the duration of the anneal, and the exposure to reactive oxygen at elevated temperature is reduced by performing part of the anneal in an unreactive gas.

The same precursor and method were used to make thin film capacitors on other wafers, the only differences being in the post-anneal step. In contrast to a post-anneal at 700° C. in $O_2$ gas for 30 minutes, other wafers were given a post-anneal in $N_2$ gas for 30 minutes, or in $O_2$ gas for 60 minutes, or in $N_2$ gas for 30 minutes followed by $O_2$ gas for 30 minutes. The measured and plotted values of remanent polarization were virtually identical to the values depicted in FIG. 5.

EXAMPLE 2

The effects of pretreatments of each dried precursor coating, before annealing, were studied.

Capacitors containing a thin film of mixed layered superlattice material were fabricated on wafers using the same precursor as in Example 1. The deposition and treatment of the precursor coatings was similar to those used for Wafers 1–3 in Example 1. In selected wafers, however, each dried precursor coating received a low-temperature pretreatment at 450° C. before being annealed at 700° C. The measured thickness of the ferroelectric thin films was in the range of from 204 nm to 211 nm.

Figure 6:
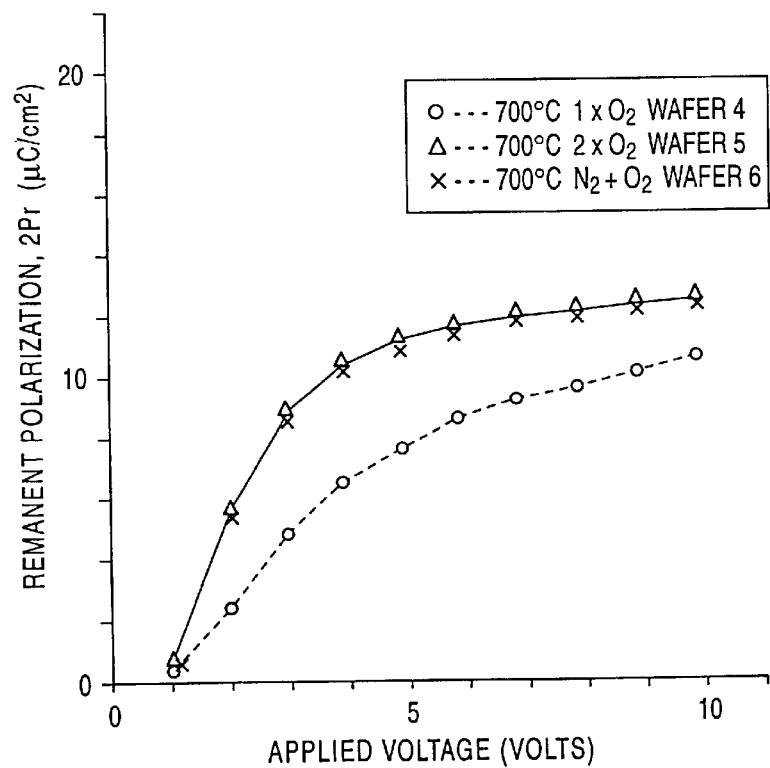
FIG. 6 is a graph of remanent polarization, 2Pr, in units of $\mu C/cm^2$, plotted as a function of applied voltage between 1 and 10 volts, in capacitors annealed at 700° C.

First, capacitors on Wafers 4, 5 and 6 were fabricated virtually identically as Wafers 1–3 of Example 1. The remanent polarizations of exemplary capacitors from Wafers 4–6 were calculated from measured hysteresis curves. The data corresponding to the exemplary capacitors of Wafers 4, 5 and 6 are labeled "$1 \times O_2$", "$2 \times O_2$" and "$N_2+O_2$", respectively. FIG. 6 is a graph of remanent polarization, 2Pr, in units of $\mu C/cm^2$, plotted as a function of applied voltage between 1 and 10 volts. The curves in FIG. 6 are similar to those in FIG. 5, although the absolute values of 2Pr are slightly lower. FIG. 6 confirms that a method of annealing a thin film of layered superlattice material in $N_2$ gas before annealing it in $O_2$ gas results in a value of remanent polarization of the layered superlattice material that is just as high or higher than the remanent polarization of layered superlattice material annealed for the same amount of time in oxygen only.

Second, capacitors on Wafers 7 and 8 were fabricated as on Wafer 6, except each dried precursor coating received a low-temperature pretreatment at 450° C. before being annealed. Pretreatment comprised either a furnace pre-anneal in $O_2$ at 450° C. or an RTP pre-anneal in $O_2$ at 450° C. The first precursor coating on Wafer 7 was pretreated with a furnace pre-anneal in $O_2$ for 10 minutes at 450° C., then given a first-layer anneal at 700° C. in $N_2$ for 10 minutes and in $O_2$ for 10 minutes. After the second precursor coating was dried, a second pretreatment was conducted with a furnace pre-anneal in $O_2$ for 10 minutes at 450° C. Then a second-layer anneal at 700° C. in $N_2$ for 60 minutes and in $O_2$ for 60 minutes was performed. The first precursor coating on Wafer 8 was pretreated with an RTP pre-anneal in $O_2$ for 5 minutes at 450° C., then given a first-layer anneal at 700° C. in $N_2$ for 10 minutes and in $O_2$ for 10 minutes. After the second precursor coating was dried, a second RTP pre-anneal was conducted in $O_2$ for 5 minutes at 450° C. Then a second-layer anneal at 700° C. in $N_2$ for 60 minutes and in $O_2$ for 60 minutes was performed.

Figure 7:
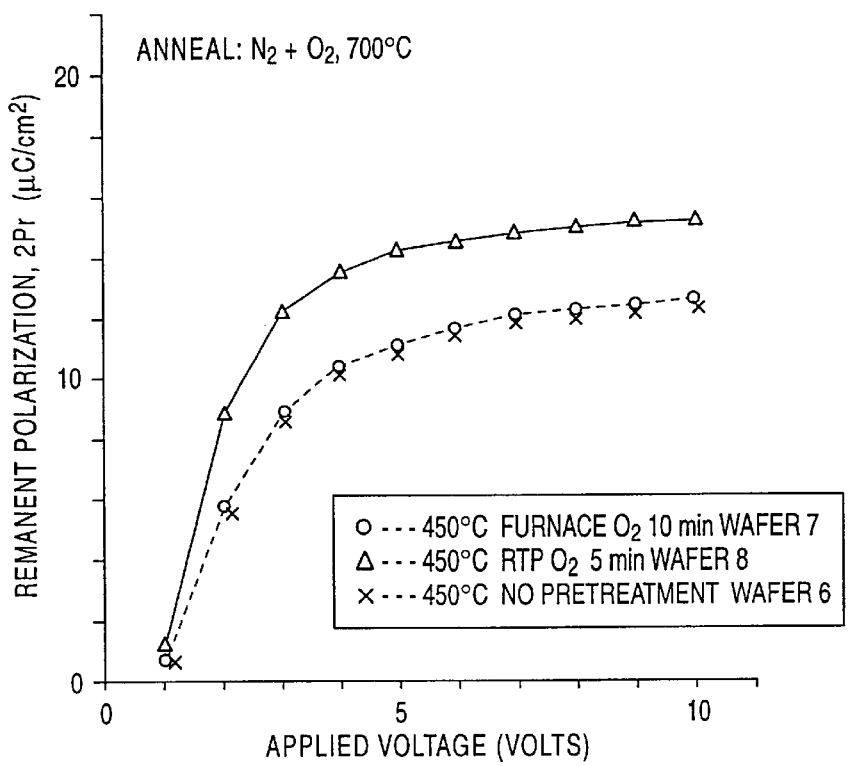
FIG. 7 is a graph of remanent polarization, 2Pr, in units of $\mu C/cm^2$, plotted as a function of applied voltage between 1 and 10 volts, in capacitors with pretreatment and annealed at 700° C.

The remanent polarizations of exemplary capacitors from Wafers 6–8 were calculated from measured hysteresis curves. FIG. 7 is a graph of remanent polarization, 2Pr, in units of $\mu C/cm^2$, plotted as a function of applied voltage between 1 and 10 volts. The data corresponding to the exemplary capacitors of Wafers 6, 7 and 8 are labeled "no pretreatment", "450° C. Furnace $O_2$" and "450° C. RTP $O_2$", respectively. In the exemplary capacitor with no pretreatment, the 2Pr value at 5 volts was about 11 $\mu C/cm^2$, as was the 2Pr value of the capacitor with the furnace pre-anneal. In contrast, in the exemplary capacitor with RTP pretreatment, the 2Pr value at 5 volts was about 14.2 $\mu C/cm^2$. The data in FIG. 7 indicate that the positive effect of annealing in $N_2$ or other unreactive gas, in accordance with the invention, is enhanced by an RTP pre-anneal in $O_2$ at low temperature, for example, at 450° C. In contrast, pretreatment by a furnace pre-anneal did not increase remanent polarization compared to no pretreatment.

EXAMPLE 3

Ferroelectric thin film capacitors were fabricated using techniques similar to those in Examples 1 and 2, except the first-layer and second-layer anneal steps were performed at 750° C.

A first group of wafers was prepared and processed as in Example 1, above. After the first precursor coating was dried, a first-layer anneal of the wafers was conducted at 750° C. Wafer 9 was annealed in a furnace at 750° C. in $O_2$ gas for 10 minutes. Wafer 10 was annealed in $O_2$ gas for 20 minutes. Wafer 11 was annealed in $N_2$ gas for 10 minutes, then in $O_2$ gas for 10 minutes.

A second spin-on coating was applied to Wafers 9–11 and dried by baking, as above. Thereafter, a second-layer anneal at 750° C. was conducted. Wafer 9 was annealed at 750° C. in a furnace in $O_2$ gas for 60 minutes. Wafer 10 was annealed in $O_2$ gas for 120 minutes. Wafer 11 was annealed in $N_2$ gas for 60 minutes, then in $O_2$ gas for 60 minutes.

These steps formed ferroelectric thin films 422 having a thickness of about 195 nm to 198 nm. As in Example 1, platinum top electrode layers were deposited, the platinum and strontium bismuth tantalum niobate layers were milled to form the capacitors, and then ashing was performed, followed by a post-anneal for 30 minutes at 750° C. in $O_2$ gas.

Thus, the ferroelectric layered superlattice material thin films in capacitors fabricated on Wafer 9 had a history of a first-layer anneal in $O_2$ for 10 minutes, and a second-layer anneal in $O_2$ for 60 minutes ("1×$O_2$"). The ferroelectric thin films in capacitors fabricated on Wafer 10 had a history of a first-layer anneal in $O_2$ for 20 minutes, and a second-layer anneal in $O_2$ for 120 minutes ("2×$O_2$"). The ferroelectric thin films in capacitors fabricated on Wafer 11 had a history of a first-layer anneal in $N_2$ for 10 minutes and in $O_2$ for 10 minutes, and a second-layer anneal in $N_2$ for 60 minutes and in $O_2$ for 60 minutes ("$N_2$+$O_2$").

Figure 8:
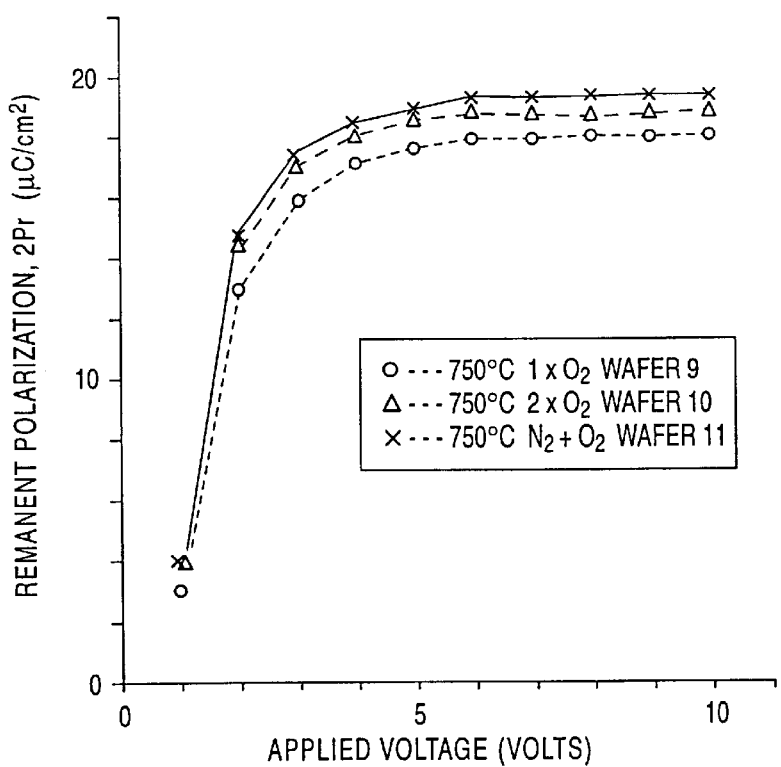
FIG. 8 is a graph of remanent polarization, 2Pr, in units of $\mu C/cm^2$, plotted as a function of applied voltage between 1 and 10 volts, in capacitors annealed at 750° C.

The remanent polarizations of exemplary capacitors from Wafers 9–11 were calculated from hysteresis curves of the capacitors. The hysteresis curves were measured at various applied voltages in the range of 1 to 10 volts. FIG. 8 is a graph of remanent polarization, 2Pr, in units of $\mu C/cm^2$, plotted as a function of applied voltage between 1 and 10 volts. The data of the exemplary capacitors of Wafers 9, 10 and 11 are labeled "1×$O_2$", "2×$O_2$" and "–$N_2$+$O_2$", respectively. The data of FIG. 8 indicate that remanent polarization in a 2×$O_2$ capacitor is higher than in a 1×$O_2$ capacitor, and the remanent polarization in an $N_2$+$O_2$ capacitor is higher still than in a 2×$O_2$ capacitor. The remanent polarization from the graph at 5 volts of the $N_2$+$O_2$ curve is about 19 $\mu C/cm^2$; of the 2×$O_2$ curve, about 18.5 $\mu C/cm^2$; while the corresponding value of the 1×$O_2$ capacitor is about 17.5 $\mu C/cm^2$. Thus, in accordance with the invention, the remanent polarization is increased by increasing the duration of the anneal, while the exposure to reactive oxygen at elevated temperature is minimized by performing part of the anneal in an unreactive gas. A useful result of the inventive method, which was unexpected in view of the prior art, is that the polarizability in the $N_2$+$O_2$ capacitor was higher than in the 2×$O_2$ capacitor.

The same precursor and method were used to make thin film capacitors on other wafers, the only differences being in the post-anneal step. In contrast to a post-anneal at 750° C. in $O_2$ gas for 30 minutes, other wafers were given a post-anneal in $N_2$ gas for 30 minutes, or in $O_2$ gas for 60 minutes, or in $N_2$ gas for 30 minutes followed by $O_2$ gas for 30 minutes. The measured and plotted values of remanent polarization were virtually identical to the values depicted in FIG. 8.

Figure 9:
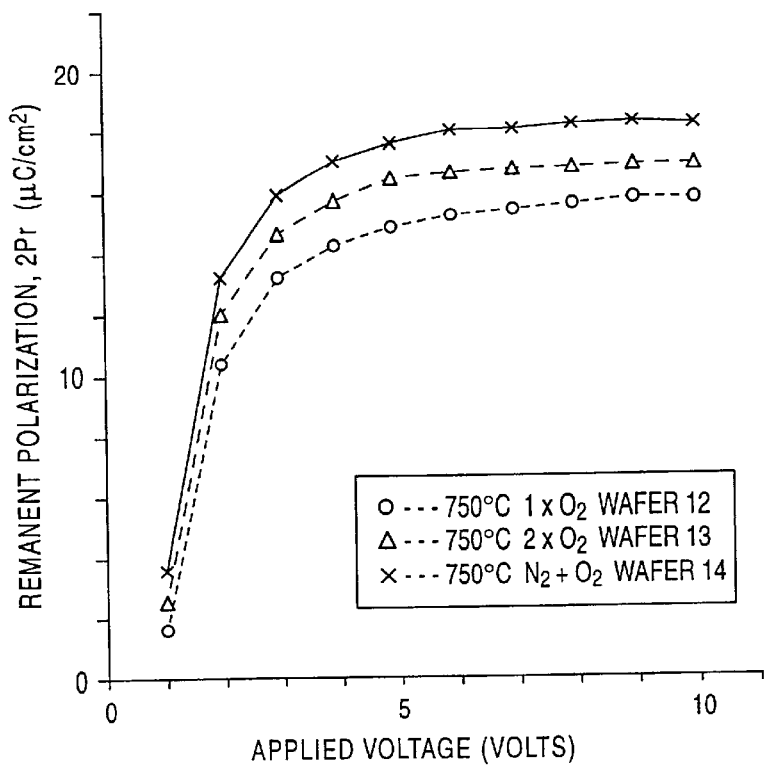
FIG. 9 is a graph of remanent polarization, 2Pr, in units of $\mu C/cm^2$, plotted as a function of applied voltage between 1 and 10 volts, in capacitors annealed at 750° C.

Capacitors on Wafers 12, 13 and 14 were fabricated virtually identically as Wafers 9–11. The remanent polarizations of exemplary capacitors from Wafers 12–14 were calculated from measured hysteresis curves. The data corresponding to the exemplary capacitors of Wafers 12, 13, and 14 are labeled "1×$O_2$", "2×$O_2$" and "$N_2$ +$O_2$", respectively. FIG. 9 is a graph of remanent polarization, 2Pr, in units of $\mu C/cm^2$, plotted as a function of applied voltage between 1 and 10 volts. The curves in FIG. 9 are similar to those in FIG. 8, although the absolute values of 2Pr are slightly lower. FIG. 9 confirms that an inventive method of annealing a thin film of layered superlattice material in $N_2$ gas before annealing it in $O_2$ gas results in greater polarizability of the layered superlattice material than in layered superlattice material annealed for the same amount of time in oxygen only.

Capacitors on Wafers 15, 16 and 17 were fabricated as on Wafer 14, except each dried precursor coating received a low-temperature pretreatment at 450° C. before being annealed at 750° C. Pretreatment comprised a hot plate bake pre-anneal in air at 450° C., a furnace pre-anneal in $O_2$ at 450° C., or an RTP pre-anneal in $O_2$ at 450° C.

The first precursor coating on Wafer 15 was pretreated with a hot plate bake pre-anneal in air for 5 minutes at 450° C., then given a first-layer anneal at 750° C. in $N_2$ for 10 minutes and in $O_2$ for 10 minutes. After the second precursor coating was dried, a second pretreatment was conducted by a hot plate bake pre-anneal in air for 5 minutes at 450° C. Then a second-layer anneal at 750° C. in $N_2$ for 60 minutes and in $O_2$ for 60 minutes was performed. The first precursor coating on Wafer 16 was pretreated with a furnace pre-anneal in $O_2$ for 10 minutes at 450° C., then given a first-layer anneal at 750° C. in $N_2$ for 10 minutes and in $O_2$ for 10 minutes. After the second precursor coating was dried, a second pretreatment was conducted with a furnace pre-anneal in $O_2$ for 10 minutes at 450° C. Then a second-layer anneal at 750° C. in $N_2$ for 60 minutes and in $O_2$ for 60 minutes was performed. The first precursor coating on Wafer 17 was pretreated with an RTP pre-anneal in $O_2$ for 5 minutes at 450° C., then given a first-layer anneal at 750° C. in $N_2$ for 10 minutes and in $O_2$ for 10 minutes. After the second precursor coating was dried, a second RTP pre-anneal was conducted in $O_2$ for 5 minutes at 450° C. Then a second-layer anneal at 750° C. in $N_2$ for 60 minutes and in $O_2$ for 60 minutes was performed. Platinum top electrode layers were deposited, the platinum and strontium bismuth tantalum niobate layers were milled to form the capacitors, and then ashing was performed, followed by a post-anneal for 30 minutes at 750° C. in $O_2$ gas.

Figure 10:
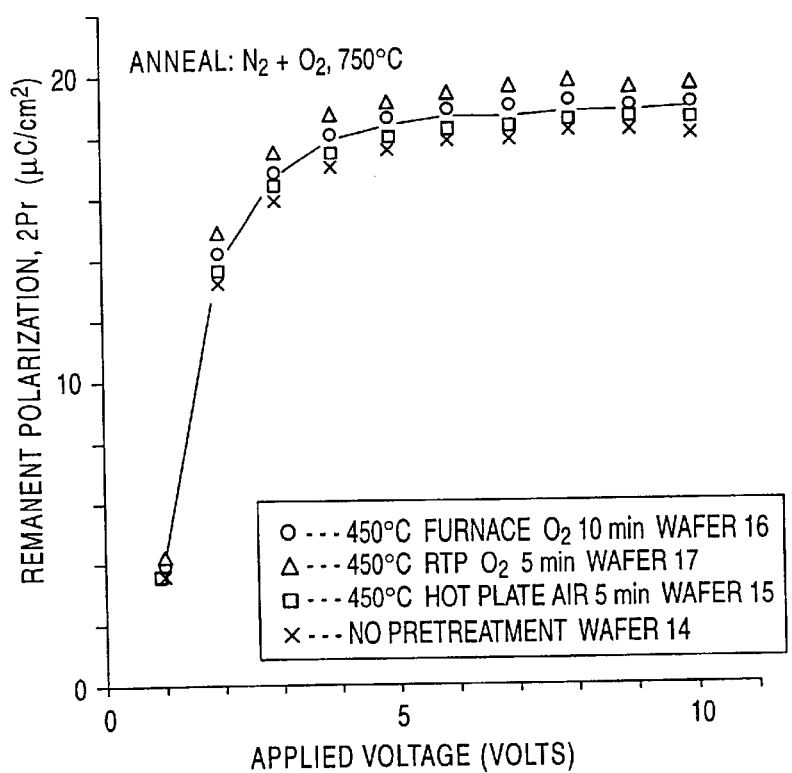
FIG. 10 is a graph of remanent polarization, 2Pr, in units of $\mu C/cm^2$, plotted as a function of applied voltage between 1 and 10 volts, in capacitors with pretreatment and annealed at 750° C.

The remanent polarizations of exemplary capacitors from Wafers 15–17 were calculated from measured hysteresis curves. FIG. 10 is a graph of remanent polarization, 2Pr, in units of $\mu C/cm^2$, plotted as a function of applied voltage between 1 and 10 volts. The data corresponding to the exemplary capacitors of Wafers 14,15, 16 and 17 are labeled "no pretreatment", "450° C. Hot Plate Air", "450° C. Furnace $O_2$" and "450° C. RTP $O_2$", respectively. In the exemplary capacitor with no pretreatment, the 2Pr value at 5 volts was about 17.7 $\mu C/cm^2$. In contrast, in the exemplary capacitor with RTP pretreatment, the 2Pr value at 5 volts was about 19.0 $\mu C/cm^2$. The 2Pr value in the capacitor with furnace pre-anneal was about 18.5 $\mu C/cm^2$; and in the hot plate pre-annealed capacitor, about 18.0 $\mu C/cm^2$. The data in FIG. 10 indicate that the positive effect of annealing in $N_2$ or other unreactive gas, in accordance with the invention, is enhanced by an RTP pre-anneal in $O_2$ at low temperature, for example, at 450° C. Pretreatment before annealing by the other techniques tested also results in increased polarizability, but the effect is smaller.

EXAMPLE 4

Ferroelectric thin film capacitors were fabricated in accordance with the invention, performing anneals at 750° C. in argon ("Ar") gas, instead of nitrogen.

A first group of wafers was prepared and processed as in Example 3, above, without pretreatment. After the first precursor coating was dried, a first-layer anneal of the wafers was conducted at 750° C. Wafer 18 was annealed in a furnace at 750° C. in $O_2$ gas for 10 minutes. Wafer 19 was annealed in $O_2$ gas for 20 minutes. Wafer 20 was annealed in argon gas for 10 minutes, then in $O_2$ gas for 10 minutes.

A second spin-on coating was applied to Wafers 18–20 and dried, as above. Thereafter, a second-layer anneal at 750° C. was conducted. Wafer 18 was annealed at 750° C. in a furnace in $O_2$ gas for 60 minutes. Wafer 19 was annealed in $O_2$ gas for 120 minutes. Wafer 20 was annealed in argon gas for 60 minutes, then in $O_2$ gas for 60 minutes. Platinum top electrode layers were deposited, the platinum and strontium bismuth tantalum niobate layers were milled to form the capacitors, and then ashing was performed, followed by a post-anneal for 30 minutes at 750° C. in $O_2$ gas.

Figure 11:
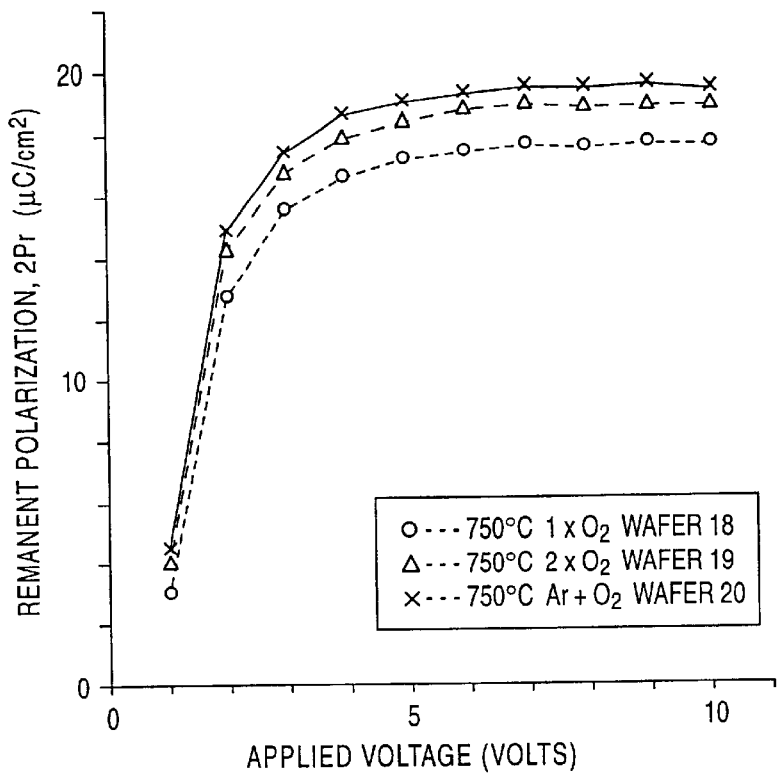
FIG. 11 is a graph of remanent polarization, 2Pr, in units of $\mu Ccm^2$, plotted as a function of applied voltage between 1 and 10 volts, in capacitors annealed at 750° C.

FIG. 11 is a graph of remanent polarization, 2Pr, in units of $\mu C/cm^2$, plotted as a function of applied voltage between 1 and 10 volts. The data corresponding to the exemplary capacitors of Wafers 18, 19, and 20 are labeled "$1 \times O_2$", "$2 \times O_2$" and "$Ar + O_2$", respectively. The curves in FIG. 11 are similar to those in FIGS. 8 and 9, with 2Pr values of similar magnitude. The results presented in FIG. 11 confirm that an inventive method of annealing a thin film of layered superlattice material in an unreactive gas before annealing it in $O_2$ gas results in greater polarizability of the layered superlattice material than in layered superlattice material annealed for the same amount of time in oxygen only.

EXAMPLE 5

Ferroelectric thin film capacitors were fabricated using techniques similar to those in Example 1, except the first-layer and second-layer anneal steps were performed at 725° C.

A first group of wafers was prepared and processed as in Example 1, above. After the first precursor coating was dried, a first-layer anneal of the wafers was conducted at 725° C. Wafer 21 was annealed in a furnace at 725° C. in $O_2$ gas for 10 minutes. Wafer 22 was annealed in $O_2$ gas for 20 minutes. Wafer 23 was annealed in $N_2$ gas for 10 minutes, then in $O_2$ gas for 10 minutes.

A second spin-on coating was applied to Wafers 21–23 and dried, as above. Thereafter, a second-layer anneal at 725° C. was conducted. Wafer 21 was annealed at 725° C. in a furnace in $O_2$ gas for 60 minutes. Wafer 22 was annealed in $O_2$ gas for 120 minutes. Wafer 23 was annealed in $N_2$ gas for 60 minutes, then in $O_2$ gas for 60 minutes.

As in Example 1, platinum top electrode layers were deposited, the platinum and strontium bismuth tantalum niobate layers were milled to form the capacitors, and then ashing was performed, followed by a post-anneal for 30 minutes at 725° C. in $O_2$ gas.

The ferroelectric layered superlattice material thin films in capacitors fabricated on Wafer 21 had a history of a first-layer anneal in $O_2$ for 10 minutes, and a second-layer anneal in $O_2$ for 60 minutes ("$1 \times O_2$"). The ferroelectric thin films in capacitors fabricated on Wafer 22 had a history of a first-layer anneal in $O_2$ for 20 minutes, and a second-layer anneal in $O_2$ for 120 minutes ("$2 \times O_2$"). The ferroelectric thin films in capacitors fabricated on Wafer 23 had a history of a first-layer anneal in $N_2$ for 10 minutes and in $O_2$ for 10 minutes, and a second-layer anneal in $N_2$ for 60 minutes and in $O_2$ for 60 minutes ("$N_2 + O_2$"). The ferroelectric thin films 422 had a thickness in the range of from 195 nm to 198 nm. Capacitors were formed as described above in Example 1.

Figure 12:
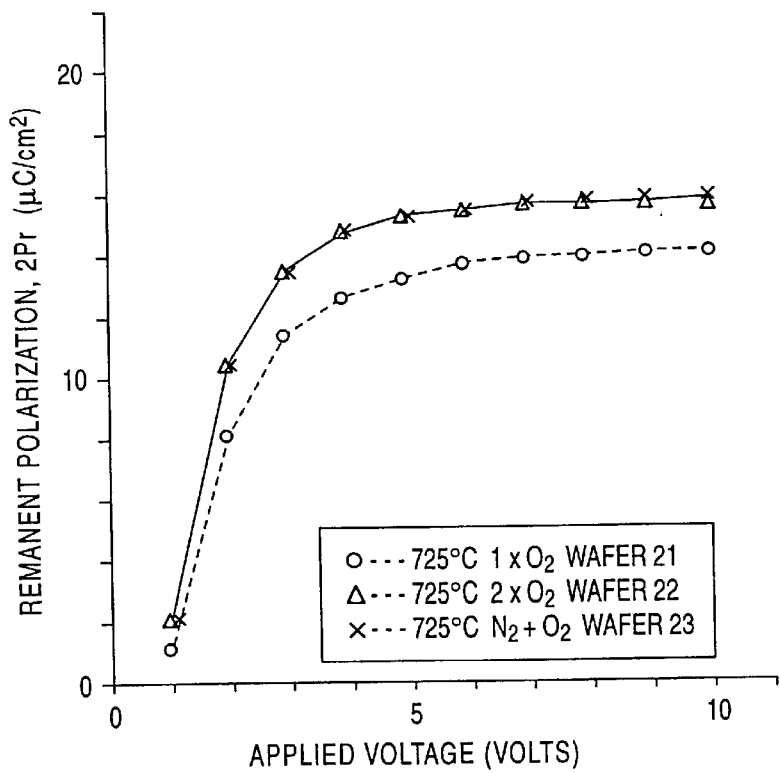
FIG. 12 is a graph of remanent polarization, 2Pr, in units of $\mu C/cm^2$, plotted as a function of applied voltage between 1 and 10 volts, in capacitors annealed at 725° C.

The remanent polarizations of exemplary capacitors from Wafers 21–23 were calculated from hysteresis curves of the capacitors. The hysteresis curves were measured at various applied voltages in the range of 1 to 10 volts. FIG. 12 is a graph of remanent polarization, 2Pr, in units of $\mu C/cm^2$, plotted as a function of applied voltage between 1 and 10 volts. The data of the exemplary capacitors of Wafers 21, 22 and 23 are labeled "$1 \times O_2$", "$2 \times O_2$" and "$N_2 + O_2$", respectively. The remanent polarization from the graph at 5 volts of the $N_2 + O_2$ and of the $2 \times O_2$ curve is about 15.5 $\mu C/cm^2$; while the corresponding value of the $1 \times O_2$ capacitor is about 13.5 $\mu C/cm^2$. The data of FIG. 12 indicate that polarizability in a $2 \times O_2$ capacitor is higher than in a $1 \times O_2$ capacitor, and the remanent polarization in a $N_2 + O_2$ capacitor is about the same as in a $2 \times O_2$ capacitor.

The same precursor and method were used to make thin film capacitors on other wafers, the only differences being in the post-anneal step. In contrast to a post-anneal at 725° C. in $O_2$ gas for 30 minutes, other wafers were given a post-anneal in $N_2$ gas for 30 minutes, or in $O_2$ gas for 60 minutes, or in $N_2$ gas for 30 minutes followed by $O_2$ gas for 30 minutes. The measured and plotted values of remanent polarization were virtually identical to the values depicted in FIG. 12.

EXAMPLE 6

A series of ferroelectric thin film capacitors were fabricated by annealing in oxygen at 700° C., without annealing in an unreactive gas, but including steps of pretreating the precursor coating at low temperature before annealing in oxygen.

Capacitors on Wafers 24 and 25 were fabricated as on Wafer 4 of Example 2 by applying two spin-on coatings, except each dried precursor coating received a low-temperature pretreatment at 450° C. before being annealed at 700° C. The first coating of precursor on Wafers 4, 24 and 25 was dehydrated by baking on a hot plate in air for one minute at 160° C., followed by four minutes at 260° C. The dried precursor coatings of Wafers 24 and 25 received a low-temperature pretreatment at 450° C. before being annealed. The pretreatment of Wafer 24 comprised a furnace bake pre-anneal in $O_2$ at 450° C. for 10 minutes. The pretreatment of Wafer 25 comprised an RTP pre-anneal in $O_2$ at 450° C. for 5 minutes.

Then a first-layer anneal of the wafers was conducted at 700° C.. Wafers 4, 24 and 25 were annealed in a furnace at 700° C. in $O_2$ gas for 10 minutes.

After the second precursor coating was applied to the wafers and dried, a second pretreatment of Wafer 24 was conducted with a furnace pre-anneal in $O_2$ for 10 minutes at 450° C. A second pretreatment of Wafer 25 was conducted with an RTP pre-anneal in $O_2$ for 5 minutes at 450° C. Then a second-layer anneal of Wafers 4, 24, and 25 was conducted at 700° C. in $O_2$ for 60 minutes. After the capacitors were formed, as in the examples above, a post-anneal was conducted at 700° C. in $O_2$ for 30 minutes.

Thus, the ferroelectric layered superlattice material thin films in capacitors fabricated on Wafers 4, 24 and 25 had a history of a first-layer anneal in $O_2$ for 10 minutes, and a second-layer anneal in $O_2$ for 60 minutes, corresponding to histories designated as "$1 \times O_2$", above.

Figure 13:
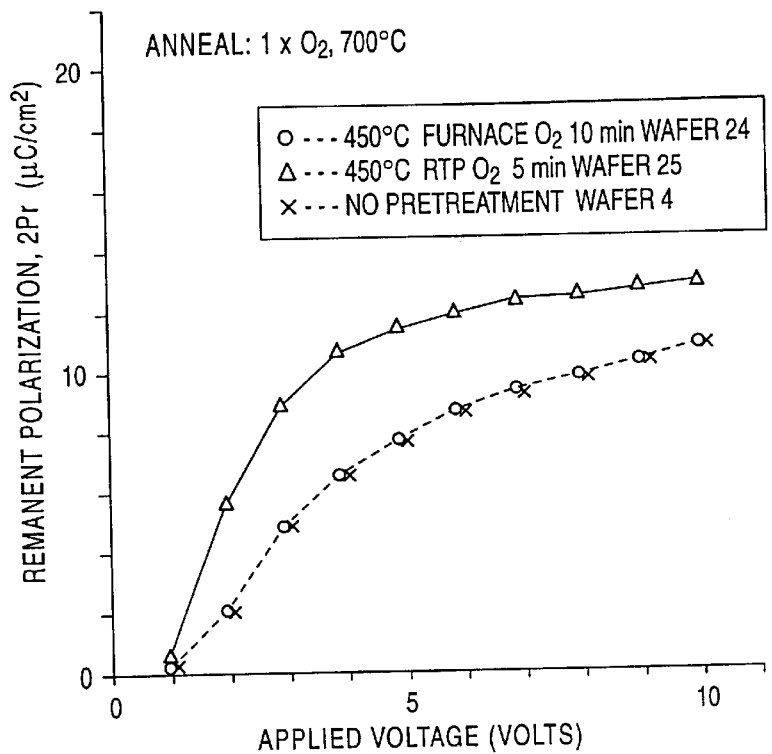
FIG. 13 is a graph of remanent polarization, 2Pr, in units of $\mu C/cm^2$, plotted as a function of applied voltage between 1 and 10 volts, in capacitors fabricated using a pretreatment at 450° C. before annealing in oxygen at 700° C.

The remanent polarizations of exemplary capacitors from Wafers 4, 24 and 25 were calculated from measured hysteresis curves. FIG. 13 is a graph of remanent polarization, 2Pr, in units of $\mu C/cm^2$, plotted as a function of applied voltage between 1 and 10 volts. The data corresponding to the exemplary capacitors of Wafers 4, 24 and 25 are labeled "no pretreatment", "450° C. Furnace $O_2$" and "450° C. RTP $O_2$", respectively. In the exemplary capacitor with no pretreatment, the 2Pr value at 5 volts was about 9.8 $\mu C/cm^2$, as was the 2Pr value of the capacitor with the furnace pre-anneal. In contrast, in the exemplary capacitor with RTP pretreatment, the 2Pr value at 5 volts was about 11.4 $\mu C/cm^2$. The data in FIG. 13 indicate the positive effect of low-temperature pretreating of a precursor coating before annealing, even when an embodiment of the invention does not include annealing in $N_2$ or other unreactive gas.

EXAMPLE 7

A series of ferroelectric thin film capacitors were fabricated by annealing in oxygen at 750° C., without annealing in an unreactive gas, but including steps of pretreating the precursor coating before annealing in oxygen.

Capacitors on Wafers 26, 27 and 28 were fabricated as on Wafer 12, in Example 3, except each dried precursor coating received a low-temperature pretreatment at 450° C. before being annealed at 750° C. Pretreatment comprised a hot plate bake pre-anneal in air at 450° C., a furnace pre-anneal in $O_2$ at 450° C., or an RTP pre-anneal in $O_2$ at 450° C.

The first precursor coating on Wafer 26 was pretreated with a hot plate bake pre-anneal in air for 5 minutes at 450° C., then given a first-layer anneal at 750° C. in $O_2$ for 10 minutes. After the second precursor coating was dried, a second pretreatment was conducted by a hot plate bake pre-anneal in air for 5 minutes at 450° C. Then a second-layer anneal at 750° C. in $O_2$ for 60 minutes was performed. The first precursor coating on Wafer 27 was pretreated with a furnace pre-anneal in $O_2$ for 10 minutes at 450° C., then given a first-layer anneal at 750° C. in $O_2$ for 10 minutes. After the second precursor coating was dried, a second pretreatment was conducted with a furnace pre-anneal in $O_2$ for 10 minutes at 450° C. Then a second-layer anneal at 750° C. in $O_2$ for 60 minutes was performed. The first precursor coating Gon Wafer 28 was pretreated with an RTP pre-anneal in $O_2$ for 5 minutes at 450° C., then given a first-layer anneal at 750° C. in $O_2$ for 10 minutes. After the second precursor coating was dried, a second RTP pre-anneal was conducted in $O_2$ for 5 minutes at 450° C. Then a second-layer anneal at 750° C. in $O_2$ for 60 minutes was performed. Platinum top electrode layers were deposited, the platinum and strontium bismuth tantalum niobate layers were milled to form the capacitors, and then ashing was performed, followed by a post-anneal for 30 minutes at 750° C. in $O_2$ gas.

Thus, the ferroelectric layered superlattice material thin films in capacitors fabricated on Wafers 12, 26, 27, and 28 had a history of a first-layer anneal in $O_2$ for 10 minutes, and a second-layer anneal in $O_2$ for 60 minutes, corresponding to histories designated as "$1 \times O_2$", above.

Figure 14:
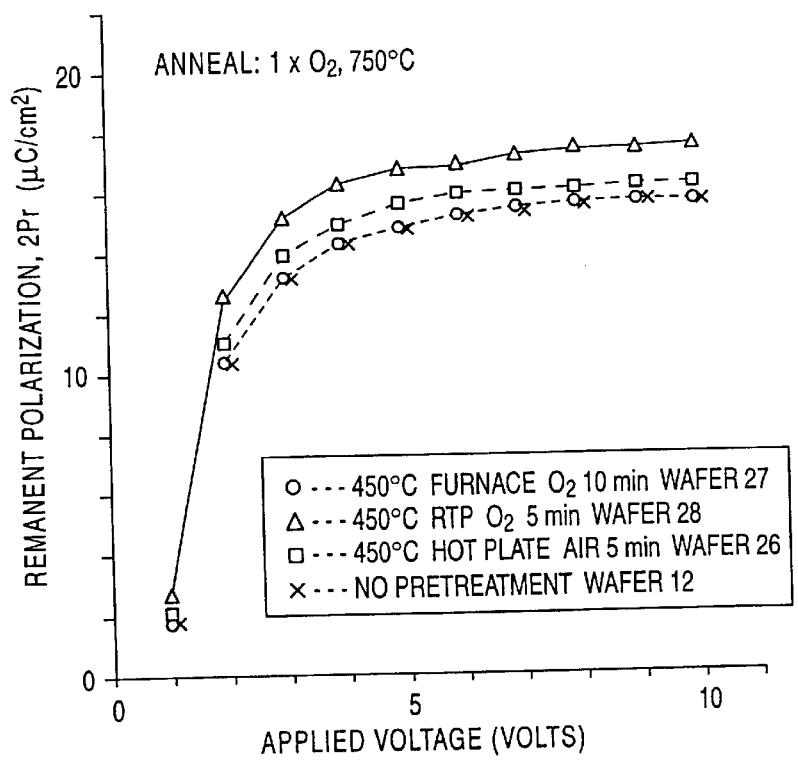
FIG. 14 is a graph of remanent polarization, 2Pr, in units of $\mu C/cm^2$, plotted as a function of applied voltage between 1 and 10 volts, in capacitors fabricated using a pretreatment at 450° C. before annealing in oxygen at 750° C.

The remanent polarizations of exemplary capacitors from Wafers 12, 26, 27, and 28 were calculated from measured hysteresis curves. FIG. 14 is a graph of remanent polarization, 2Pr, in units of $\mu C/cm^2$, plotted as a function of applied voltage between 1 and 10 volts. The data corresponding to the exemplary capacitors of Wafers 12, 26, 27, and 28 are labeled "no pretreatment", "450° C. Hot Plate Air", "450° C. Furnace $O_2$" and "450° C. RTP $O_2$", respectively. In the exemplary capacitor with no pretreatment, the 2Pr value at 5 volts was about 15.0 $\mu C/cm^2$, as it was for the capacitor with a furnace pre-anneal. In contrast, in the exemplary capacitor with RTP pretreatment, the 2Pr value at 5 volts was about 16.4 $\mu C/cm^2$; and in the capacitor with a hot plate bake pre-anneal, about 15.8 $\mu C/cm^2$. The data in FIG. 14 indicate the positive effect of low-temperature pretreatment of a precursor coating before annealing, even when an embodiment of the invention does not include annealing in $N_2$ or other unreactive gas. Pretreatment by an RTP pre-anneal in $O_2$ at low temperature, for example, at 450° C., is shown to be effective. Pretreatment before annealing by hot plate bake pre-anneal in air was also effective.

EXAMPLE 8

A ferroelectric thin film capacitor containing layered superlattice material was fabricated, in accordance with the invention, by annealing in $N_2$ at 600° C. prior to $O_2$ annealing at 600° C. The remanent polarization of the capacitor was measured to study the effects of the inventive annealing on electrical properties.

Capacitors containing a thin film of mixed layered superlattice material were fabricated on wafers using the same precursor as in Examples 1–7. Wafers were prepared as in Example 1. The spin-on application of the precursor coatings was done at 1100 rpm for 40 seconds. Two layers of precursor coating were applied. The first coating layer was dried at 160° C. for one minute, then at 260° C. for 4 minutes. Then the second coating was applied and dried similarly. After the second coating had been dried, the wafers were furnace annealed in $N_2$ gas at 600° C. for 62 hours, with 10 minutes push-pull. Then the wafers were annealed in $O_2$ gas at 600° C. for 60 minutes. After the top electrode layer was formed, a post-anneal was conducted in oxygen at 600° C. for 30 minutes. Capacitors were formed as in the examples above. The exemplary capacitor tested had a surface area of 6940 $\mu Mm^2$, and the ferroelectric thin film had a thickness of about 206 nm. From hysteresis curves measured at applied voltages in the range of 1 to 10 volts, the remanent polarization, 2Pr, was calculated. At 5 volts, the exemplary capacitor had a 2Pr value of about 5.3 $\mu C/cm^2$.

EXAMPLE 9

A ferroelectric thin film capacitor containing layered superlattice material was fabricated, in accordance with the invention, by conducting an RTP pre-anneal at 600° C., followed by annealing in $N_2$ at 600° C. for four hours, and then in $O_2$ at 600° C. for 60 minutes. The remanent polarization of the capacitor was measured to study the effects on electrical properties as a result of the RTP pre-anneal and the subsequent annealing.

Capacitors containing a thin film of mixed layered superlattice material were fabricated on wafers using the same precursor as in Examples 1–7. Wafers were prepared as in Example 1. The spin-on application of the precursor coatings was done at 1100 rpm for 40 seconds. A total of two layers of precursor coating were applied.

On the wafers, the first coating layer was dried at 160° C. for one minute, then at 260° C. for 4 minutes. A "pre-anneal" wafer was then given an RTP pre-anneal at 600° C. for 5 minutes. A "no pre-anneal" wafer did not receive a pre-anneal. The second coating was applied to the wafers and dried similarly. The "pre-anneal" wafer was then given a second RTP pre-anneal at 600° C. for 5 minutes. The "no pre-anneal" wafer did not receive a second pre-anneal. Then both wafers were furnace annealed in $N_2$ gas at 600° C. for four hours, with 10 minutes push-pull, followed by an anneal in $O_2$ gas at 600° C. for 60 minutes. After the platinum top electrode layer was formed, top electrodes were defined by ion mill etching, and a post-anneal was conducted in oxygen at 600° C. for 60 minutes. The exemplary capacitors had a surface area of 7854 $\mu m^2$, and the ferroelectric thin films had a thickness of about 200 nm. From hysteresis curves measured at applied voltages in the range of 1 to 7 volts, the remanent polarization, 2Pr, was calculated. At 7 volts, the exemplary "pre-anneal"capacitor had a 2Pr value of about 6.2 $\mu C/cm^2$. The "no pre-anneal capacitor" had a 2Pr value of only about 2.7 $\mu C/cm^2$. Other exemplary capacitors were formed in a similar manner, but the RTP pre-annealing was performed at one of the temperatures 450° C., 500°0 C., or 550° C. These capacitors did not display hysteresis when tested. The measurements on the exemplary capacitor given the RTP pre-anneal at 600° C. show the utility of using an RTP pre-anneal together with annealing in an inert gas and in oxygen, at low temperatures, for example, at 600° C.

Comparison of the data plotted in the graphs of FIGS. 5–14 indicates that remanent polarization of a thin film of layered superlattice material increases as annealing temperature increases. Also, at a given temperature, the remanent polarization increases as the duration of the annealing time increases. For a given annealing temperature and duration, however, the remanent polarization is maintained or actually increased if annealing is conducted a significant portion of the total annealing time in an oxygen-free unreactive gas. Thus, in accordance with the invention, the elevated temperature to which an integrated circuit is subjected, or the time of exposure to oxygen at elevated temperature, or both temperature and oxygen exposure can be decreased. This may result in faster commercial production runs. More importantly, it avoids the deleterious effects of oxygen on the semiconductor substrate and other structures and materials of integrated circuits. Further, a heating pretreatment, especially by RTP, of a substrate having a precursor coating increases the remanent polarization of the ferroelectric thin film.

There has been described a method for fabricating ferroelectric integrated circuit devices in which the process heating and annealing temperatures do not exceed 800° C., and which reduces the time of exposure of the integrated circuit to oxygen at elevated temperatures, to produce devices with good electronic properties. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described without departing from the inventive concepts. For example, now that a method for fabricating thin films of layered superlattice materials has been disclosed that includes annealing in an unreactive gas and low-temperature pretreatment, this method can be combined with other processes to provide variations on the method described. It is also evident that the steps recited may in some instances be performed in a different order; or equivalent structures and processes may be substituted for the various structures and processes described. Consequently, the invention is to be construed as embracing each and every novel feature and novel combination of features present in and/or possessed by the fabrication processes, electronic devices, and electronic device manufacturing methods described.

We claim:

1. A method of fabricating a thin film of layered superlattice material comprising:

providing a substrate;
providing a precursor containing metal moieties in effective amounts for forming a layered superlattice material;
applying said precursor to said substrate;
annealing said substrate in an unreactive gas at a temperature in a range of from 600° C. to 800° C.; and
annealing said substrate in an oxygen-containing gas at a temperature in a range of from 600° C. to 800° C.

2. A method as in claim 1 wherein said annealing in said unreactive gas is conducted before said annealing in said oxygen-containing gas.

3. A method as in claim 1 wherein said annealing in said unreactive gas is conducted after said annealing in said oxygen-containing gas.

4. A method as in claim 1 wherein said annealing in said unreactive gas is conducted for a time period in the range of from 30 minutes to 100 hours.

5. A method as in claim 1 wherein said annealing in said unreactive gas is conducted for a time period not exceeding 60 minutes.

6. A method as in claim 1 wherein said annealing in said unreactive gas is conducted at a temperature not exceeding 750° C.

7. A method as in claim 1 wherein said annealing in said unreactive gas is conducted at a temperature not exceeding 725° C.

8. A method as in claim 1 wherein said annealing in said unreactive gas is conducted at a temperature not exceeding 700° C.

9. A method as in claim 1 wherein said unreactive gas comprises a gas selected from the group consisting of nitrogen, argon and helium.

10. A method as in claim 1 wherein said unreactive gas is substantially pure $N_2$ gas.

11. A method as in claim 1 wherein said annealing in said oxygen-containing gas is conducted for a time period in the range of from 30 minutes to two hours.

12. A method as in claim 1 wherein said annealing in said oxygen-containing gas is conducted for a time period not exceeding 60 minutes.

13. A method as in claim 1 wherein said annealing in said oxygen-containing gas is conducted at a temperature not exceeding 750° C.

14. A method as in claim 1 wherein said annealing in said oxygen-containing gas is conducted at a temperature not exceeding 725° C.

15. A method as in claim 1 wherein said annealing in said oxygen-containing gas is conducted at a temperature not exceeding 700° C.

16. A method as in claim 1 wherein said oxygen-containing gas is substantially pure $O_2$ gas.

17. A method as in claim 1 wherein said metal moieties include strontium, bismuth and tantalum.

18. A method as in claim 1 wherein said metal moieties include strontium, bismuth, tantalum and niobium.

19. A method as in claim 1, further comprising a step of heating said substrate after said applying said precursor and before said annealing in said unreactive gas.

20. A method as in claim 19 wherein said heating is conducted at a temperature not exceeding 600° C.

21. A method as in claim 20 wherein said heating comprises a step of drying said substrate.

22. A method as in claim 21 wherein said step of drying is conducted at a temperature not exceeding 300° C.

23. A method as in claim 21 wherein said step of drying is conducted in an oxygen-containing gas.

24. A method as in claim 19 wherein said heating comprises a step of pretreating at a temperature in a range of from 300° C. to 600° C.

25. A method as in claim 24 wherein said step of pretreating comprises rapid thermal processing said substrate.

26. A method as in claim 25 wherein said rapid thermal processing is conducted in an oxygen-containing gas.

27. A method as in claim 25 wherein rapid thermal processing is conducted at a temperature not exceeding 450° C.

28. A method as in claim 25 wherein said rapid thermal processing is conducted for a time period in a range of from 1 minute to 15 minutes.

29. A method as in claim 28 wherein said rapid thermal processing is conducted for 5 minutes.

30. A method as in claim 24 wherein said step of pretreating comprises a hot plate baking of said substrate.

31. A method as in claim 30 wherein said hot plate baking is conducted for a time period in a range of from 1 minute to 15 minutes.

32. A method as in claim 30 wherein said hot plate baking is conducted at a temperature not exceeding 450° C.

33. A method as in claim 24 wherein said step of pretreating comprises a furnace pre-anneal of said substrate.

34. A method as in claim 33 wherein said furnace pre-anneal is conducted for a time period in a range of from 1 minute to 15 minutes.

35. A method as in claim 33 wherein said furnace pre-anneal is conducted at a temperature not exceeding 450° C.

36. A method as in claim 1 wherein said substrate comprises a first electrode, and further comprising steps of forming a second electrode on said thin film after said step of annealing, to form a capacitor, and subsequently performing a step of post-annealing.

37. A method as in claim 36 wherein said first electrode and said second electrode each comprise platinum.

38. A method as in claim 36 wherein said step of post-annealing is conducted at a temperature in a range of from 600° C. to 800° C.

39. A method as in claim 36 wherein said step of post-annealing is conducted for a time period in a range of from 30 minutes to two hours.

40. A method as in claim 36 wherein said step of post-annealing includes heating in an unreactive gas.

41. A method as in claim 36 wherein said step of post-annealing includes heating in an oxygen-containing gas.

42. A method as in claim 1 wherein said thin film has a thickness not exceeding 300 nm.

43. A method as in claim 1 wherein said thin film has a thickness not exceeding 220 nm.

44. A method as in claim 1 wherein said thin film has a thickness not exceeding 100 nm.

45. A method of fabricating a thin film of layered superlattice material comprising:
providing a substrate;
providing a precursor containing metal moieties in effective amounts for forming a layered superlattice material;
applying said precursor to said substrate;
pretreating said substrate at a temperature in a range of from 300° C. to 600° C. after said applying; and
annealing said substrate in an oxygen-containing gas at a temperature in a range of from 600° C. to 800° C. after said pretreating.

46. A method as in claim 45 wherein said step of pretreating comprises rapid thermal processing said substrate.

47. A method as in claim 46 wherein said rapid thermal processing is conducted in an oxygen-containing gas.

48. A method as in claim 46 wherein rapid thermal processing is conducted at a temperature not exceeding 450° C.

49. A method as in claim 46 wherein said rapid thermal processing is conducted for a time period in a range of from 1 minute to 15 minutes.

50. A method as in claim 46 wherein said rapid thermal processing is conducted for 5 minutes.

51. A method as in claim 45 wherein said step of pretreating comprises a hot plate baking of said substrate.

52. A method as in claim 51 wherein said hot plate baking is conducted for a time period in a range of from 1 minute to 15 minutes.

53. A method as in claim 51 wherein said hot plate baking is conducted at a temperature not exceeding 450° C.

54. A method as in claim 45 wherein said step of pretreating comprises a furnace pre-anneal of said substrate.

55. A method as in claim 54 wherein said furnace pre-anneal is conducted for a time period in a range of from 1 minute to 15 minutes.

56. A method as in claim 54 wherein said furnace pre-anneal is conducted at a temperature not exceeding 450° C.

* * * * *